(12) United States Patent  
Seidenfaden et al.

(10) Patent No.: US 10,431,954 B2  
(45) Date of Patent: Oct. 1, 2019

(54) LASER COMPONENT

(71) Applicant: OSRAM Opto Semiconductors GmbH, Regensburg (DE)

(72) Inventors: Jan Seidenfaden, Neumarkt i.d. Oberpfalz (DE); Jan Marfeld, Regensburg (DE); Hubert Schmid, Painten (DE); Soenke Tautz, Tegernheim (DE); Roland Enzmann, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/654,136

(22) Filed: Jul. 19, 2017

(65) Prior Publication Data

US 2018/0026421 A1    Jan. 25, 2018

(30) Foreign Application Priority Data

Jul. 21, 2016   (DE) .................. 10 2016 113 470

(51) Int. Cl.
*H01S 5/00*     (2006.01)
*H01S 5/022*    (2006.01)
(Continued)

(52) U.S. Cl.
CPC .......... *H01S 5/02244* (2013.01); *H01S 5/005* (2013.01); *H01S 5/0092* (2013.01);
(Continued)

(58) Field of Classification Search
CPC .. H01S 5/02244; H01S 5/4093; H01S 5/0092; H01S 5/005; H01S 5/02484;
(Continued)

(56) References Cited

U.S. PATENT DOCUMENTS 6,836,497 B1 * 12/2004  Hatori ................ H01S 5/02252
                                                            372/38.01
8,872,203 B2    10/2014  Nagahama et al.
(Continued)

FOREIGN PATENT DOCUMENTS

DE    10 2004 016 232 A1    1/2005
DE    10 2005 034 793 B3    4/2007
(Continued)

OTHER PUBLICATIONS

English Translation of JP2009-99664 (Year: 2009).*
(Continued)

*Primary Examiner* — Yuanda Zhang
(74) *Attorney, Agent, or Firm* — DLA Piper LLP (US)

(57)    ABSTRACT

A laser component includes a housing, a laser chip arranged in the housing, and a conversion element for radiation conversion arranged in the housing wherein the conversion element is irradiatable with laser radiation of the laser chip. A method of producing such a laser component includes providing component parts of the laser component including a laser chip, a conversion element for radiation conversion and housing parts, and assembling the component parts of the laser component such that a housing is provided within which the laser chip and the conversion element are arranged, wherein the conversion element is irradiatable with laser radiation of the laser chip.

17 Claims, 9 Drawing Sheets

(51) Int. Cl.
*H01S 5/024* (2006.01)
*H01S 5/40* (2006.01)

(52) U.S. Cl.
CPC ...... *H01S 5/02268* (2013.01); *H01S 5/02272* (2013.01); *H01S 5/02276* (2013.01); *H01S 5/02296* (2013.01); *H01S 5/02438* (2013.01); *H01S 5/02484* (2013.01); *H01S 5/4093* (2013.01); *H01L 2224/32245* (2013.01); *H01L 2224/73265* (2013.01); *H01S 5/0224* (2013.01); *H01S 5/02212* (2013.01); *H01S 5/02252* (2013.01); *H01S 5/02469* (2013.01); *H01S 2301/176* (2013.01)

(58) Field of Classification Search
CPC ............. H01S 5/02272; H01S 5/02276; H01S 5/02268; H01S 2301/176; H01L 2224/32245; H01L 2224/73265
See application file for complete search history.

(56) References Cited

U.S. PATENT DOCUMENTS

| | | | | |
|---|---|---|---|---|
| 2002/0191655 | A1* | 12/2002 | Heck | G02B 7/027 372/36 |
| 2008/0116473 | A1* | 5/2008 | Sugiyama | H01L 33/483 257/98 |
| 2009/0003400 | A1* | 1/2009 | Nagahama | H01L 33/483 372/50.23 |
| 2009/0322208 | A1* | 12/2009 | Shaikevitch | H01L 33/507 313/503 |
| 2013/0100635 | A1* | 4/2013 | Xu | F21V 9/00 362/19 |
| 2014/0072812 | A1 | 3/2014 | Hamada et al. | |
| 2015/0357790 | A1 | 12/2015 | Jeoung et al. | |
| 2016/0091171 | A1 | 3/2016 | Okada | |
| 2016/0190418 | A1* | 6/2016 | Inomata | H01L 33/507 257/98 |
| 2017/0051883 | A1* | 2/2017 | Raring | H01S 5/005 |

FOREIGN PATENT DOCUMENTS

| | | |
|---|---|---|
| DE | 10 2013 101 598 A1 | 8/2014 |
| JP | 61-83065 U | 6/1986 |
| JP | 2003-243761 A | 8/2003 |
| JP | 2004-207551 A | 7/2004 |
| JP | 2009-99664 A | 5/2009 |
| JP | 2012-186326 A | 9/2012 |
| WO | 2007/105647 A1 | 7/2009 |

OTHER PUBLICATIONS

German Search Report dated Mar. 28, 2017 in corresponding German Patent Application No. 10 2016 113 470.8.
Notice of Reasons for Rejection dated Aug. 28, 2018, of counterpart Japanese Patent Application No. 2017-141345, including an English translation.

* cited by examiner

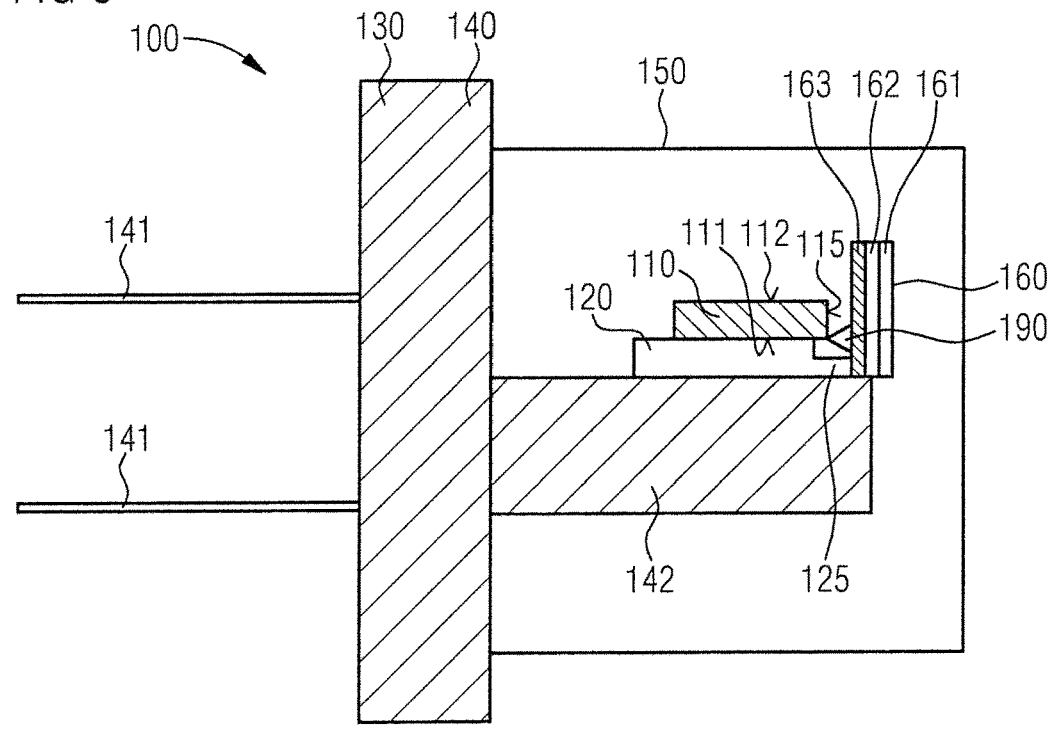
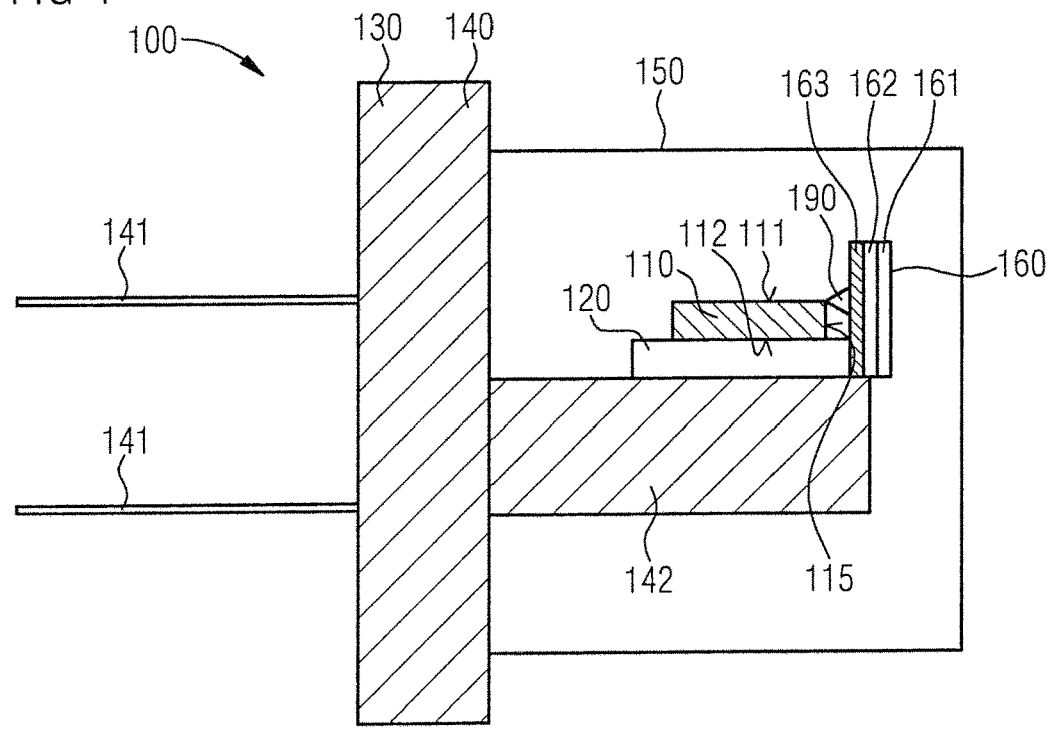

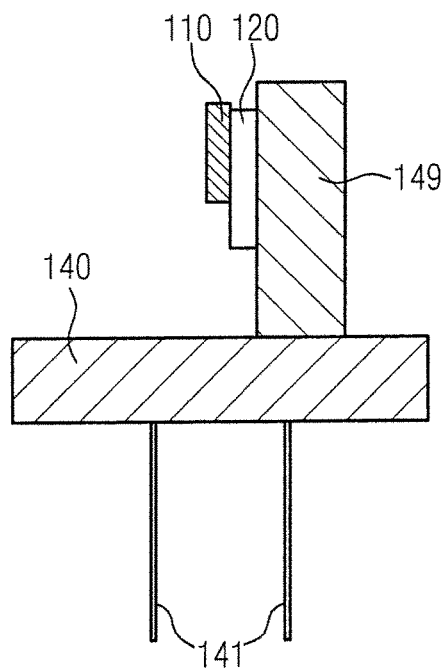
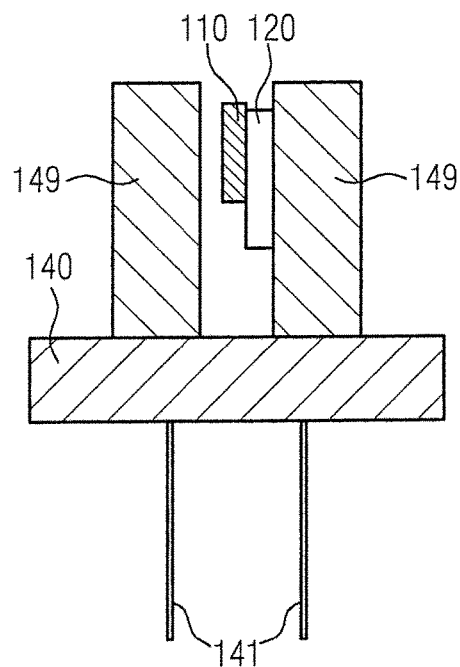
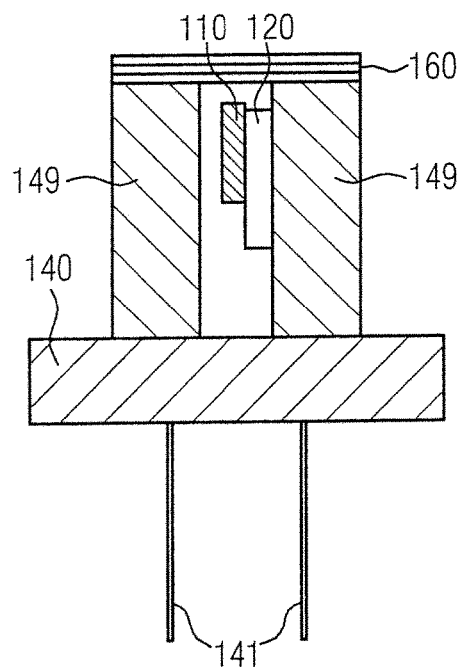

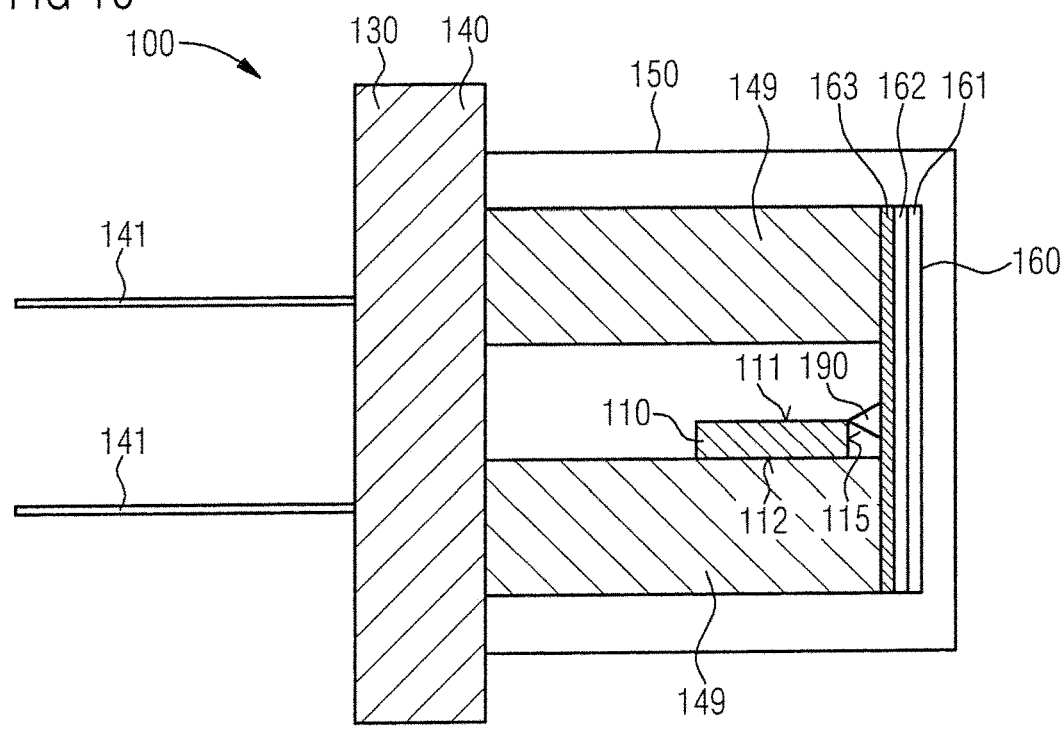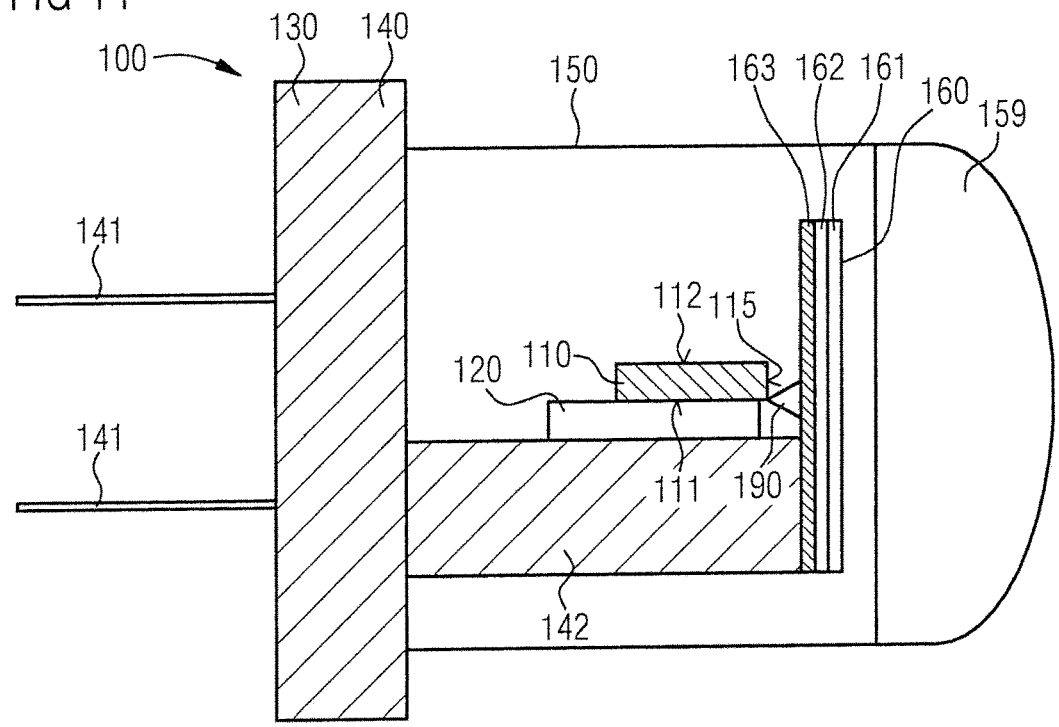

LASER COMPONENT

TECHNICAL FIELD

This disclosure relates to a laser component comprising a housing and a laser chip as well as a method of producing a laser component.

BACKGROUND

Semiconductor light sources such as, for example, light emitting diodes or laser diodes are increasingly being used for lighting applications. This concerns, for example, headlights of motor vehicles.

In one known configuration referred to as LARP (Laser Activated Remote Phosphor), one or a plurality of laser components are used to generate a blue laser radiation. Such a laser component typically comprises a TO housing (Transistor Outline), within which a laser chip is situated. The blue light radiation is projected onto a separate sheet-shaped conversion element via optical elements such as, for example, lenses or integrators. The conversion element is situated at a distance from the laser component(s). With the aid of the conversion element, the blue light radiation may be at least partly converted such that a white light radiation may be generated. A thermal energy that arises as power loss during the radiation conversion may substantially be dissipated in a lateral direction of the conversion element.

It could therefore be helpful to provide an improved laser component and a corresponding method of producing a laser component.

SUMMARY

We provide a laser component including a housing, a laser chip arranged in the housing, and a conversion element for radiation conversion arranged in the housing, wherein the conversion element is irradiatable with laser radiation of the laser chip.

We also provide a method of producing the laser component including a housing, a laser chip arranged in the housing, and a conversion element for radiation conversion arranged in the housing, wherein the conversion element is irradiatable with laser radiation of the laser chip, including providing component parts of the laser component including a laser chip, a conversion element for radiation conversion and housing parts, and assembling the component parts of the laser component such that a housing is provided within which the laser chip and the conversion element are arranged, wherein the conversion element is irradiatable with laser radiation of the laser chip.

BRIEF DESCRIPTION OF THE DRAWINGS

FIG. 3 shows a lateral illustration of a further laser component comprising a conversion element arranged on a chip carrier, wherein the chip carrier has a stepped shape.

FIG. 4 shows a lateral illustration of a further laser component comprising a conversion element arranged on a chip carrier.

FIGS. 7 to 9 show steps of producing the laser component from FIG. 5.

FIG. 10 shows a lateral illustration of a further laser component comprising thermally conductive holding parts, wherein a laser chip is arranged on one holding part.

FIG. 11 shows a lateral illustration of a further laser component comprising a cap comprising a lens.

LIST OF REFERENCE SIGNS

Figure 1:
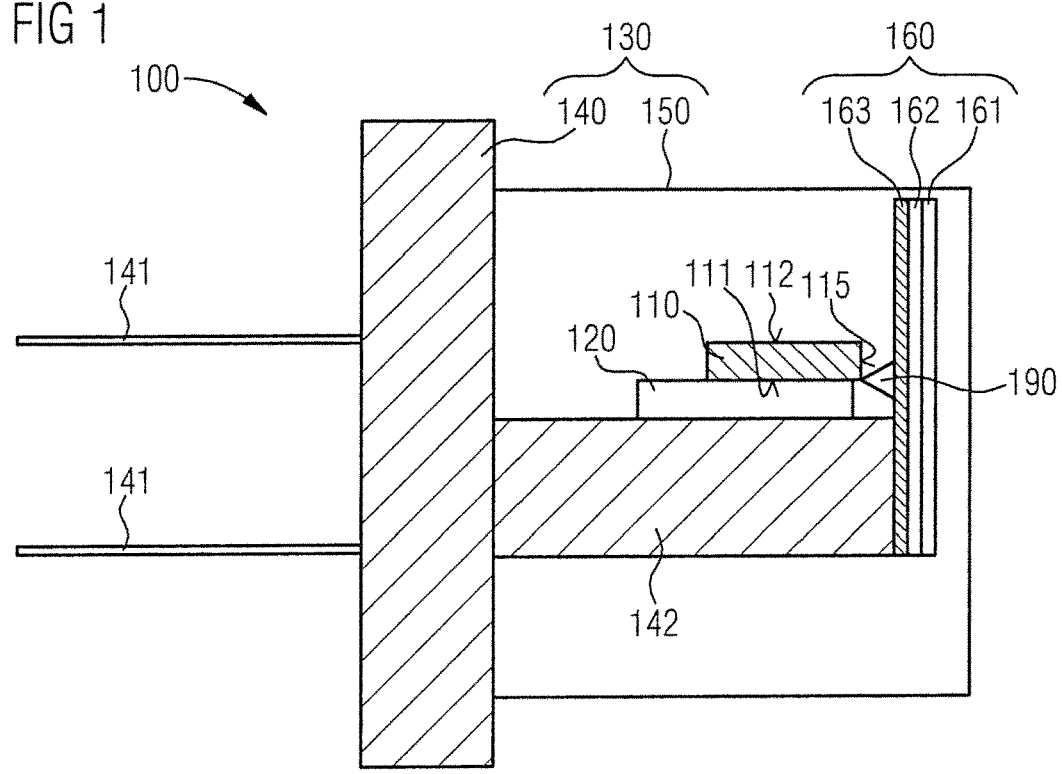
FIG. 1 shows a lateral illustration of a laser component comprising a housing, a laser chip and a conversion element, wherein the housing comprises a base part and a cap, wherein the conversion element comprises a phosphor layer, a reflective layer arranged on the phosphor layer, and a thermally conductive layer arranged on the reflective layer, wherein the laser chip is arranged on a chip carrier, and wherein the chip carrier and the conversion element are arranged on a mounting section of the base part.

100 Laser component
110 Laser chip
111 Side
112 Side
115 Emission facet
120 Chip carrier
125 Shoulder
130 Housing
140 Base part
141 Terminal pin
142 Mounting section
149 Holding part
150 Cap
159 Lens
160 Conversion element
161 Phosphor layer
162 Reflective layer
163 Thermally conductive layer
165 Opening
167 Soldering surface
169 Lens
190 Laser radiation
191 Irradiated region 195 Active region
263 Thermally conductive layer

DETAILED DESCRIPTION

Our laser component may comprise a housing, a laser chip arranged in the housing, and a conversion element for radiation conversion, the conversion element being arranged in the housing. The conversion element is irradiatable with laser radiation of the laser chip.

The laser component comprises an integrated conversion element. The conversion element is situated together with a laser chip in a housing of the laser component. In this way, the laser chip and the conversion element may be reliably protected against external influences. The conversion element is arranged with respect to the laser chip such that the conversion element may be irradiated with a laser radiation generated by the laser chip, also called primary light radiation hereinafter, during operation of the laser component. With the aid of the conversion element, the primary light radiation may be at least partly converted. As a result, the conversion element and hence the laser component may emit radiation that may comprise primary and secondary, that is to say non-converted and converted, radiation portions.

The laser component comprising the conversion element integrated in the housing may be realized more compactly and in a manner saving more space than a conventional LARP construction. Furthermore, the conversion element may be positioned at a small distance from the laser chip. During operation of the laser component, it is possible in this way to generate a small luminous spot having high power density on the conversion element such that radiation emission from the laser component with high luminance is possible. The use of an optical element between the laser chip and the conversion element is not necessary for this purpose.

Further possible details and examples that may be considered for the laser component are described with greater scrutiny below.

The laser radiation generated by the laser chip may be a blue light radiation, for example. The entire radiation emitted by the laser component, which radiation may comprise a converted radiation portion besides the blue light radiation, may be a white light radiation, for example. In this way, the laser component may be employed, for example, in a headlight of a motor vehicle.

The conversion element may comprise a phosphor layer. The radiation conversion may be effected with the aid of the phosphor layer. The phosphor layer may comprise one phosphor or a plurality of different phosphors that convert primary light radiation into one or a plurality of different secondary light radiations. This may involve, for example, a yellow, a green and/or a red light radiation. The phosphor layer may be a ceramic layer.

The conversion element may be configured in a plate-shaped or laminar fashion and have a planar configuration. The conversion element may be provided for a mode of operation in transmission. In this case, the conversion element may have a side facing the laser chip and may be irradiated with the laser radiation. Via an opposite side thereto of the conversion element, light emission, that is to say emission of primary and secondary radiation portions, may be carried out.

During the radiation conversion, a thermal energy may be generated as power loss in the phosphor layer of the conversion element. The laser component may be configured to the effect that the heat may be dissipated in an efficient manner. Thermally governed changes in the conversion properties and the luminance may be suppressed as a result. Efficient dissipation of heat may be achieved with the aid of the examples explained below.

The phosphor layer of the conversion element may comprise a thermally conductive material with one phosphor or a plurality of different phosphors embedded therein. As a result, it is possible for the heat generated in the phosphor layer already to be distributed in the phosphor layer. This may be fostered by use of a thermally conductive material having a high thermal conductivity. These include aluminum nitride, for example.

The conversion element may comprise a thermally conductive layer that dissipates heat from the phosphor layer. The thermally conductive layer may be thermally coupled to the phosphor layer and a further component part of the laser component. In this way, the thermally conductive layer may bring about heat spreading and serve as a heat sink to dissipate the heat generated in the phosphor layer and feed it to the further component part of the laser component. The thermally conductive layer may be formed from a material having a high thermal conductivity, for example, from a metallic material such as copper, for example. Efficient dissipation of heat may be fostered in this way.

Apart from a metal, the thermally conductive layer may also be formed from some other material. By way of example, a configuration composed of ceramic, diamond, sapphire or a basic or matrix material with embedded carbon nanotubes is possible.

The conversion element may be configured such that the phosphor layer is partly concealed by the thermally conductive layer. In this case, the phosphor layer may be irradiated with laser radiation of the laser chip in a region in which the phosphor layer is not concealed by the thermally conductive layer. The following example may be taken into consideration in this context.

The thermally conductive layer may comprise a frame-shaped configuration having an opening. In this example, the phosphor layer may be irradiated with laser radiation of the laser chip via the opening of the thermally conductive layer. The frame shape of the thermally conductive layer, as a result of which the point at which heat arises may be laterally enclosed, enables efficient heat spreading and heat dissipation to be fostered.

The conversion element may comprise a reflective layer arranged on the phosphor layer. The phosphor layer may be irradiated with laser radiation of the laser chip via the reflective layer. In this case, the reflective layer may be situated on a side of the phosphor layer facing the laser chip. Backscattering of radiation from the conversion element in the direction of the laser chip may be suppressed or minimized with the aid of the reflective layer. Radiation emission with high luminance may be fostered in this way. The reflective layer may be configured such that light radiation having a wavelength in the range of the laser radiation may be transmitted by the reflective layer, thereby introduced into the phosphor layer and at least partly converted, and that the reflective layer is highly reflective for light radiation having a different or greater wavelength, that is to say for conversion radiation generated in the phosphor layer.

If the conversion element is configured with a phosphor layer, a reflective layer and an thermally conductive layer, the phosphor layer may be coated with the reflective layer on a side facing the laser chip. The thermally conductive layer may be arranged on the reflective layer and may thereby be thermally coupled to the phosphor layer via the reflective layer. Alternatively, the thermally conductive layer may be arranged directly on the phosphor layer or on a side of the phosphor layer facing the laser chip and may thereby be directly thermally coupled to the phosphor layer. In this case, the reflective layer may be situated in a region on the phosphor layer in which the phosphor layer is not concealed by the thermally conductive layer. In a frame-shaped configuration of the thermally conductive layer such as was described above, the reflective layer may be arranged on the phosphor layer within the opening of the thermally conductive layer.

The conversion element may additionally comprise a further thermally conductive layer. The further thermally conductive layer may likewise be used to dissipate heat from the phosphor layer. The phosphor layer is arranged between the thermally conductive layer and the further thermally conductive layer. Efficient dissipation of heat may be fostered further by this construction.

The two thermally conductive layers may be situated on both sides of the phosphor layer and thermally coupled thereto. Furthermore, the two thermally conductive layers may be arranged on opposite sides of the conversion element. These may be the side facing the laser chip and is irradiatable with the laser radiation of the laser chip and the side of the conversion element opposite thereto and is used for light emission.

Features and details mentioned above with regard to the thermally conductive layer may be analogously applied to the further thermally conductive layer. Individual or a plurality of the examples mentioned below may be present in this context. The further thermally conductive layer may be formed from a metal or some other material, for example, ceramic, diamond, sapphire or a basic or matrix material with embedded carbon nanotubes. The further thermally conductive layer may be arranged directly on the phosphor layer or on a side of the phosphor layer facing away from the laser chip. The conversion element may be configured such that the phosphor layer is partly covered by the further thermally conductive layer. Light emission from the conversion element or from the phosphor layer may be carried out in a region in which the phosphor layer is not concealed by the further thermally conductive layer. For this purpose, the further thermally conductive layer may comprise a frame-shaped configuration having an opening. In this example, the light emission may be carried out via the opening of the further thermally conductive layer.

The conversion element may comprise a soldering surface. The soldering surface may be configured in the form of a metallic layer and be arranged on the thermally conductive layer. In this configuration, the conversion element may be secured in the housing via a soldering connection. In this case, the conversion element may mechanically and thermally connect to a further component part of the laser component with the aid of the soldering surface and by a solder. The soldering connection enables reliable securing of the conversion element, and fosters efficient dissipation of heat for the conversion element. Depending on the configuration of the laser component, the conversion element may comprise only one, or else a plurality of or two soldering surfaces.

The laser chip may be an edge emitting laser chip. In this configuration, the laser chip comprises a lateral emission facet via which the laser radiation may be emitted from the laser chip. Adjoining the emission facet, the laser chip may comprise two opposite longitudinal sides, which may form a top side and an underside of the laser chip. The laser radiation may be emitted with a characteristic beam divergence via the emission facet in the vicinity of one of the longitudinal sides.

The laser chip may be arranged on a chip carrier. The chip carrier, which may be referred to as a submount, may serve as a heat sink of the laser chip. The chip carrier may comprise a thermally conductive ceramic material. The laser chip may be arranged with one of the longitudinal sides on the chip carrier. This may involve that longitudinal side near which the laser radiation is emitted. A shading of the divergently emitted laser radiation may be avoided in various ways. By way of example, the laser chip may be arranged on the chip carrier such that the laser chip projects with the emission facet laterally relative to the chip carrier. It is also possible for the chip carrier to have a stepped cross-sectional shape. In this case, the laser chip may be arranged on the chip carrier such that the laser chip projects with the emission facet laterally relative to a mounting side of the chip carrier that is provided to mount of the laser chip.

The laser chip may be arranged on a further component part of the laser component with the aid of the chip carrier described above. A direct arrangement of the laser chip on a further component part is also possible, that is to say without the use of a chip carrier. If a chip carrier is used, the conversion element may also be arranged on the chip carrier.

The housing of the laser component may be a standard housing such as, for example, a TO housing (Transistor Outline). In this way, it is possible to use already existing production techniques to produce the laser component, and cost-effective production is possible.

The housing may comprise a base part and a cap connected to the base part. The base part and the cap may enclose an encapsulated interior, in which the laser chip and the conversion element are arranged. The base part and the cap may comprise a metallic material and be thermally conductive as a result. The base part may be a TO header, and the cap may be a TO cap. Furthermore, the base part and the cap may connect to one another by a welding connection.

The base part may comprise a projecting mounting section. The mounting section, which may be referred to as a stem and which may likewise comprise a metallic material, may be used to mount further component parts.

As was indicated above, the laser chip may be arranged on a chip carrier serving as a heat sink. In a further example, the chip carrier is arranged on the mounting section of the base part. In this way, during operation of the laser component, heat generated in the laser chip may be dissipated via the chip carrier and furthermore the mounting section and the rest of the base part.

The conversion element may be arranged on the mounting section. As a result, it is also possible for heat to be reliably dissipated from the conversion element via the mounting section and thus the base part. In this configuration, the conversion element may mechanically and thermally connect to the mounting section of the base part with the aid of the above-described soldering surface and by a solder.

If the chip carrier and the conversion element are both arranged on the mounting section of the base part, the chip carrier may be arranged on a mounting side of the mounting section that is provided for the chip carrier, and the conversion element may be arranged on a side of the mounting section that is oriented perpendicularly to the mounting side.

The conversion element may be arranged on the chip carrier. In this way, heat may be reliably dissipated from the conversion element, like the laser chip likewise arranged on the chip carrier, via the chip carrier and furthermore via the mounting section and the rest of the base part. In this configuration, the conversion element may mechanically and thermally connect to the chip carrier with the aid of the above-described soldering surface and by a solder. The laser chip may be arranged on a mounting side and the conversion element may be arranged on a side of the chip carrier oriented perpendicularly to the mounting side. If the laser chip is arranged on the chip carrier with a longitudinal side near which the laser radiation is emitted, the above-described configuration of the chip carrier having the stepped cross-sectional shape may be employed to avoid shading of the laser radiation.

A joint arrangement of the laser chip and the conversion element on the chip carrier affords the possibility of providing a relatively small or minimum distance between the laser chip and the conversion element. As a result, it is possible to achieve a relatively high or maximum power density on the conversion element such that radiation emission with high luminance may be fostered.

Furthermore, the abovementioned example affords the possibility of an optical measurement carried out in the context of production being carried out as early as after arrangement of the laser chip and the conversion element on the chip carrier. During production of a plurality of laser components, defective components may thereby be identified in an earlier method stage.

The laser component may comprise a plurality of thermally conductive holding parts arranged on the base part. The conversion element is arranged on the plurality of holding parts. In this way, heat may be dissipated from the conversion element via the holding parts and the base part. Efficient dissipation of heat from the conversion element is possible on account of the plurality of holding parts. The holding parts may comprise a thermally conductive ceramic material. The above-described configuration of the conversion element comprising a plurality of soldering surfaces may be employed to secure the conversion element. In this case, the conversion element may mechanically and thermally connect to the holding parts with the aid of the soldering surfaces and by a solder.

The laser chip, as was specified above, may be arranged on a chip carrier serving as a heat sink. The chip carrier may be arranged on one of the thermally conductive holding parts mentioned above. In this way, during operation of the laser component, heat generated in the laser chip may be dissipated via the chip carrier and furthermore via the relevant holding part and the base part.

The laser chip itself may be arranged on one of the holding parts. In this case, the relevant holding part may serve as chip carrier, and heat may be dissipated from the laser chip via the holding part and the base part. By virtue of the direct arrangement of the laser chip on the holding part, dissipation of heat from the laser chip may be fostered. Furthermore, a cost saving is possible.

Furthermore, consideration may be given to a configuration in which the laser component comprises a or only one thermally conductive holding part arranged on the base part. In this case, too, the laser chip or a chip carrier carrying the laser chip may be arranged on the holding part. The conversion element may be arranged on the holding part, or on the chip carrier.

The cap connected to the base part may comprise a radiation-transmissive exit window. During operation of the laser component, the light radiation emitted by the conversion element, which light radiation may comprise primary and secondary radiation portions, may be transmitted through the exit window and thereby be emitted by the laser component.

The cap may comprise a radiation-transmissive optical element. In this configuration, the optical element may form an exit window of the cap. In this case, the light radiation emitted by the conversion element may pass through the optical element and beam shaping may be brought about with the aid of the optical element. The optical element integrated in the cap may be a lens, for example. The light radiation, which may be emitted in scattered form by the conversion element, may be focused, for example, in this way.

The conversion element may comprise a radiation-transmissive optical element. The optical element of the conversion element may be a lens, for example. In this way, too, beam shaping, for example, focusing of the light radiation emitted by the conversion element may be brought about. Furthermore, the optical element of the conversion element enables additional heat dissipation. The optical element may be arranged on a side of a phosphor layer of the conversion element facing away from the laser chip.

With regard to the above-described configuration of the conversion element comprising a thermally conductive layer and a further thermally conductive layer, between which a phosphor layer is arranged, the optical element may be arranged on the further thermally conductive layer.

A configuration comprising an integrated optical element makes it possible to use the laser component in a device or a system, for example, a headlight without additional optical elements. Consequently, a compact design is made possible even at the system level.

Further configurations and details may be considered for the laser component. With regard to electrical contacting, the base part may comprise terminal pins, for example. The terminal pins may be secured on the base part in an electrically insulated manner and may extend through the base part. The laser chip may electrically connect to the terminal pins. Electrical contact structures, for example, bond wires and a contact pad on a chip carrier or a thermally conductive holding part, may be employed for this purpose.

The laser component may comprise only one laser chip arranged in the housing. An example in which the laser component comprises a plurality of laser chips arranged in the housing and in which the conversion element likewise situated in the housing is irradiatable with laser radiation of the plurality of laser chips is also possible. The plurality of laser chips may be arranged alongside one another in the housing. With respect to such a construction, the examples explained above may be analogously employed. By way of example, individual or a plurality of the following configurations may be present.

Each laser chip may be arranged on a dedicated chip carrier. Alternatively, a plurality of laser chips may be arranged on a common chip carrier. The chip carrier(s) may be arranged on a projecting mounting section of a base part connected to a cap. The conversion element may likewise be arranged on the mounting section. A configuration in which the conversion element is arranged on the chip carrier(s) is also possible.

In a configuration of the laser component comprising a plurality of thermally conductive holding parts arranged on a base part and comprising the conversion element arranged thereon, the chip carrier(s) may be arranged on one of the holding parts. It is also possible for a plurality of laser chips to be directly arranged on the relevant holding part. This correspondingly holds true for a configuration of the laser component comprising one thermally conductive holding part, on which the chip carrier(s) or a plurality of laser chips may be arranged directly. In this case, the conversion element may be arranged on the holding part, or on the chip carrier(s).

We also provide a method of producing a laser component. The laser component has the above-described construction or a construction in accordance with one or a plurality of the examples described above. In the method, component parts of the laser component comprising a laser chip, a conversion element for radiation conversion and housing parts are provided. A further step is assembling the component parts of the laser component such that a housing is provided, within which the laser chip and the conversion element are arranged, wherein the conversion element is irradiatable with laser radiation of the laser chip.

The laser component produced with the aid of the method comprises a conversion element integrated in the housing. As a result, the laser component may have a compact design. Moreover, the conversion element may be arranged at a small distance from the laser chip. Operation of the laser component with radiation emission with high luminance is possible as a result.

The following examples may be employed with regard to the production method. By way of example, the conversion element provided may comprise a phosphor layer and a thermally conductive layer. Forming the thermally conductive layer may be carried out with the aid of a sputtering method. The conversion element may furthermore be provided with a reflective layer. The reflective layer may be formed on a side of the phosphor layer facing the laser chip in the laser component. The thermally conductive layer, which may be frame-shaped, may be formed on the reflective layer. It is also possible to form the thermally conductive layer and the reflective layer on the side of the phosphor layer which faces the laser chip in the laser component. In this case, the reflective layer may be provided on the phosphor layer in a region in which the phosphor layer is not concealed by the thermally conductive layer.

A further possible step, which may be carried out in the context of providing the conversion element, is forming at least one soldering surface on the thermally conductive layer. Furthermore, an optical element such as, for example, a lens may be arranged on the phosphor layer, specifically on the side of the phosphor layer which faces away from the laser chip in the laser component.

With regard to the housing parts, a base part and a cap may be provided. The base part may comprise a projecting mounting section. The laser chip may be arranged on a chip carrier, and the chip carrier may subsequently be arranged on the mounting section. The conversion element, too, may be arranged on the mounting section. It is also possible to mount the conversion element together with the laser chip on the chip carrier, and subsequently to arrange the chip carrier on the mounting section. A soldering process may be carried out in each case in the steps mentioned above.

It is furthermore possible to provide a base part, a cap and a plurality of thermally conductive holding parts. In this case, a chip carrier provided with the laser chip may be arranged on one of the holding parts, and this holding part and at least one further holding part may be mounted on the base part. The conversion element may subsequently be secured on the plurality of holding parts. The laser chip may alternatively be positioned directly on one of the holding parts. It is also possible for the conversion element to be premounted on a holding part, and for the relevant holding part to be secured on the base part and the conversion element to be secured on at least one further holding part, already situated on the base part. The holding part already present on the base part may be provided with the chip carrier or laser chip. A soldering process may be carried out in each case in the steps mentioned above.

At the end of the method, the base part and the cap may be connected to one another, for example, by welding. Before this step, electrical connections between the laser chip and terminal pins arranged on the base part may furthermore be produced, for example, by connecting bond wires.

The advantageous examples and developments as explained above may be employed individually or else in arbitrary combination with one another—apart from, for example, in cases of unambiguous dependencies or incompatible alternatives.

The above-described properties, features and advantages and the way in which they are achieved will become clearer and more clearly understood in association with the following description of examples explained in greater detail in association with the schematic drawings.

Possible configurations of laser components 100 are described with reference to the following schematic figures. The laser components 100 comprise a housing 130, a laser chip 110 that generates a laser radiation 190, and a conversion element 160 comprising a phosphor layer 161 for radiation conversion, the conversion element being irradiatable with the laser radiation 190. The laser chip 110 and the conversion element 160 are arranged in the housing 130. As a result, the laser components 100 may have a compact and space-saving construction. Furthermore, the conversion element 160 may be positioned at a small distance from the laser chip 110 as a result of which radiation emission with high luminance is possible. The laser components 100 are configured to the effect that efficient dissipation of heat from the conversion element 160 may be achieved. The laser components 100 may be referred to as laser package and, on account of the integrated conversion element 160 comprising the phosphor layer 161, as phosphor integrated laser package. The laser components 100 may be configured to generate a white light radiation and may thereby be used, for example, in a headlight of a motor vehicle.

The figures are merely schematic in nature and are not true to scale. In this sense, component parts and structures shown in the figures may be illustrated with exaggerated size or reduction of size to afford a better understanding. In the same way, the laser components 100 may comprise further component parts and structures besides component parts and structures shown and described.

FIG. 1 shows a schematic lateral illustration of a laser component 100. The laser component 100 comprises a housing 130, a laser chip 110 and a conversion element 160. The housing 130 comprises two housing parts, specifically a base part 140 and a cap 150 connected to the base part 140. The housing parts 140, 150 enclose an interior in which the laser chip 110 and the conversion element 160 are arranged and thereby protected against external influences. The housing 130 may be a so-called TO housing (Transistor Outline), also called TO can. In this case, the base part 140 may also be referred to as a TO header and the cap 150 as a TO cap.

The housing parts 140, 150 may comprise a metallic material and may connect to one another by a welding connection. On a side facing away from the base part 140 (right-hand side in FIG. 1) the cap 150 may comprise an exit window (not shown) composed of a radiation-transmissive material. Light radiation generated in the laser component 100 during operation may be emitted via the exit window.

For electrical contacting, the laser component 100 comprises two terminal pins 141 projecting outward from the base part 140. The terminal pins 141 are secured on the base part 140 in an electrically insulated manner and extend through the base part 140 to the interior enclosed by the housing 130. The terminal pins 141 are electrically connected to the laser chip 110 such that the laser chip 110 may be supplied with electrical energy via the terminal pins 141 (not illustrated in each case). This will be discussed in even greater detail further below.

The laser chip 110, which may be referred to as a semiconductor laser or laser diode chip, is an edge emitting laser chip. In this configuration, the laser chip 110 comprises a lateral side surface 115, via which the laser chip 110 may emit a laser radiation 190 during operation. The side surface 115 is referred to as emission facet 115 hereinafter. The laser radiation 190, also referred to as primary light radiation hereinafter, may be a blue light radiation. As is indicated in FIG. 1, the laser radiation 190 may be emitted with a characteristic beam divergence from the emission facet 115. The laser chip 110 may have, for example, an output power in the mW range or some other output power, for example, in the W range.

The laser chip has two opposite sides or longitudinal sides 111, 112 adjoining the emission facet 115, which form a top side and an underside of the laser chip 100. As is shown in FIG. 1, the laser radiation 190 is emitted from the emission facet 115 in the vicinity of one of the longitudinal sides, in the vicinity of the longitudinal side 111 in the present case.

The laser chip 110 comprises a p-doped semiconductor region, an n-doped semiconductor region and, arranged therebetween, an active zone that generates radiation (not illustrated). The p-doped semiconductor region, which may have a smaller thickness than the n-doped semiconductor region, may be situated in the region of the longitudinal side 111, and the n-doped semiconductor region may be situated in the region of the longitudinal side 112. Furthermore, the laser chip 110 comprises a metallic contact pad (not illustrated) on each of the longitudinal sides 111, 112. Electrical energy for the generation and thus emission of the laser radiation 190 may be fed to the laser chip 110 via the contact pads.

A further constituent of the laser component 100 is, as shown in FIG. 1, a chip carrier 120, that carries the laser chip 110. The laser chip 110 is arranged on a mounting side of the chip carrier 120 provided for the laser chip 110. The chip carrier 120, which may be referred to as a submount, serves as a heat sink for the laser chip 110. The chip carrier 120 may comprise a thermally conductive ceramic material such as aluminum nitride, for example. The arrangement comprising the chip carrier 120 and the laser chip 110 may also be referred to as a chip on submount assembly (COSA).

In the design shown in FIG. 1, the laser chip 110 is arranged with the longitudinal side 111 on the chip carrier 120. In accordance with the above-indicated orientation of the p- and n-doped semiconductor regions of the laser chip 110, this construction may be characterized by the designation p-down, and in this respect to the chip carrier 120 provided with the laser chip 110 may be designated as p-down COSA. FIG. 1 furthermore shows that the laser chip 110 is arranged on the chip carrier 120 such that the laser chip 110 projects with the emission facet 115 laterally relative to the chip carrier 120. This prevents the laser radiation 190 emitted in the vicinity of the longitudinal side 111 from being shaded by the chip carrier 120.

The chip carrier 120 comprises a metallic mating contact pad on the mounting side on which the laser chip 110 is arranged. The mating contact pad of the chip carrier 120 and the contact pad present on the longitudinal side 111 of the laser chip 110 may electrically and mechanically connect to one another via an electrically conductive connection material such as, for example, a solder (respectively not illustrated).

As is furthermore shown in FIG. 1, the base part 140 comprises a projecting mounting section 142, which likewise comprises a metallic material. The mounting section 142 may also be designated as a stem. The chip carrier 120 provided with the laser chip 110 is arranged on a mounting side of the mounting section 142 provided for the chip carrier 120. The chip carrier 120 and the mounting section 142 may be connected to one another by a solder. For this purpose, on a side opposite the side of the chip carrier 120 with the laser chip 110 and facing the mounting section 142, the chip carrier 120 may have a metallic coating (respectively not illustrated).

The conversion element 160 used for radiation conversion has a laminar configuration and, as shown in FIG. 1, comprises a ceramic phosphor layer 161, a reflective layer 162 arranged on the phosphor layer 161, and a thermally conductive layer 163 arranged on the reflective layer 162. The conversion element 160 is arranged on an end side of the mounting section 142 oriented perpendicularly to the mounting side. Proceeding therefrom, the conversion element 160 projects relative to the mounting section 142 such that during operation of the laser component 100 the conversion element 160 may be irradiated with the laser radiation 190 on a side facing the laser chip 110.

The phosphor layer 161 forms a side of the conversion element 160 facing away from the laser chip 110 and via which radiation may be emitted during operation of the laser component 100. The phosphor layer 161 comprises one phosphor or a plurality of different phosphors to convert the primary blue light radiation 190 emitted by the laser chip 110 at least partly into one or a plurality of different secondary light radiations of longer wavelength. This may involve, for example, a yellow, a green and/or a red light radiation. In this way, a light radiation which may comprise primary and secondary, that is to say non-converted and converted, radiation portions (not illustrated) may be emitted in the direction of the exit window of the cap 150 by the phosphor layer 161 on the side facing away from the laser chip 110. The light radiation may have a white color and may be emitted from the laser component 100 via the exit window.

Figure 2:
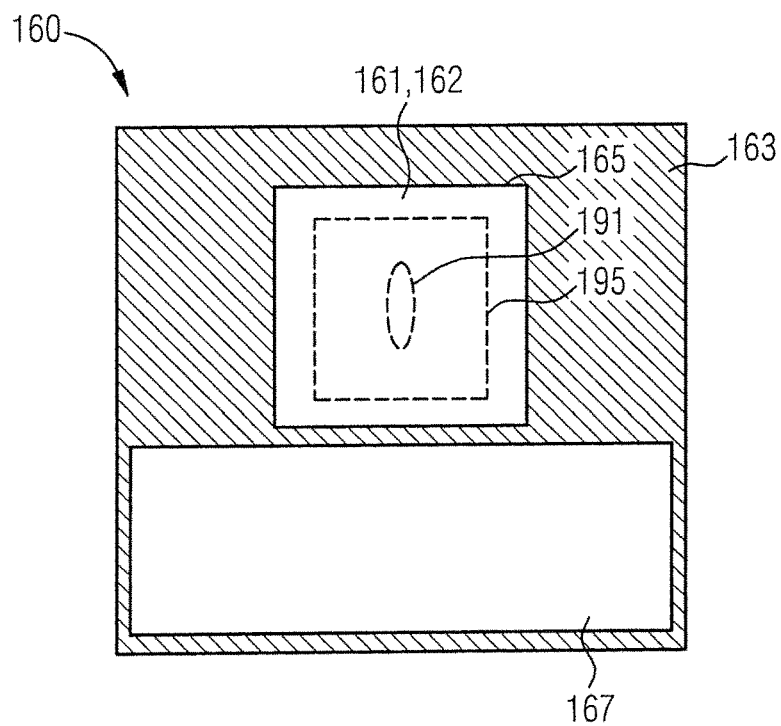
FIG. 2 shows a plan view illustration of the conversion element from FIG. 1 with a soldering surface.

FIG. 2 shows a plan view illustration of the conversion element 160, on the basis of which further details will become clear. With respect to FIG. 1, FIG. 2 illustrates that side of the conversion element 160 facing the laser chip 110. The thermally conductive layer 163 arranged on the reflective layer 162 comprises a frame-shaped configuration having an opening 165. In the region of the opening 165, the reflective layer 162 and thus the phosphor layer 161 situated underneath are not concealed by the thermally conductive layer 163. In this way, the reflective layer 162 and the phosphor layer 161 may be irradiated with the laser radiation 190 in this region.

The reflective layer 162 situated on a side of the phosphor layer 161 facing the laser chip 110 is configured to the effect that the laser radiation 190 may be transmitted by the reflective layer 162 and thereby introduced into the phosphor layer 161. During operation of the laser component 100, the reflective layer 162 provides for reflection of the conversion radiation generated in the phosphor layer 161. What may be achieved in this way is that backscattering of radiation from the conversion element 160 in the direction of the laser chip 110 and a loss of efficiency associated therewith are minimal. With regard to the blue laser radiation 190, the reflective layer 162 may be configured such that only light radiation below a wavelength of approximately 500 nm may pass through the layer 162, and that the layer 162 is highly reflective for radiation above approximately 500 nm.

FIG. 2 indicates with the aid of a dashed line a region 191 in which the conversion element 160 and thus the phosphor layer 161 may be irradiated with the laser radiation 190 during operation of the laser component 100. The shown elliptical shape of the irradiated region 191 is a consequence of an elliptical mode profile of the laser chip 110. A further dashed line illustrates an active region 195 in which radiation may be emitted on the side of the conversion element 160 facing away from the laser chip 110. The active region 195 is larger than the irradiated region 191. This is due to the radiation conversion involving absorption of primary radiation and re-emission of secondary radiation in all possible spatial directions, and due to scattering occurring in the phosphor layer 161. In a departure from the rectangular shape shown, the emission region 195 may have a round, for example, elliptical or circular, geometry.

As is shown in FIG. 1, the conversion element 160 may be arranged in direct proximity to the emission facet 115 of the laser chip 110. As a result, the irradiated region 191 indicated in FIG. 2 may be relatively small and a high power density may be present in the region 191. As a consequence, it is possible to achieve radiation emission with high luminance from the conversion element 160 and thus from the laser component 100. The use of an optical element between the laser chip 110 and the conversion element 160 is not necessary for this purpose.

FIG. 2 furthermore shows that the conversion element 160 comprises a soldering surface 167 arranged on the thermally conductive layer 163. The soldering surface 167, which may also be referred to as a soldering pad, may be configured in the form of a metallic layer composed of indium, for example. The conversion element 160 may connect to the mounting section 142 of the base part 140 with the aid of the soldering surface 167 and via a solder (not illustrated).

As indicated above, the terminal pins 141 arranged on the base part 140 electrically connects to the laser chip 110 such that electrical energy may be fed to the laser chip 110 via the terminal pins 141. This may be realized with the aid of bond wires (not illustrated). In this case, one terminal pin 141 may connect to the contact pad on the longitudinal side 112 of the laser chip 110 via a bond wire. The other terminal pin 141 may connect to the mating contact pad of the chip carrier 120 via a further bond wire, the mating contact pad in turn electrically connecting to the contact pad on the longitudinal side 111 of the laser chip 110.

The operation of the laser chip 110 is associated with heat generation in the laser chip 110. The heat may be efficiently dissipated via the chip carrier 120 connected to the laser chip 110 and, furthermore, via the mounting section 142 adjoining the chip carrier, and via the rest of the base part 140. Radiation conversion that takes place in the phosphor layer 161 of the conversion element 160 likewise results in heat generation. Efficient dissipation of heat from the phosphor layer 161, without compromising the luminance in the process, may be achieved as follows.

The phosphor layer 161 of the conversion element 160 may comprise a thermally conductive material having a high thermal conductivity with the phosphor or the plurality of phosphors embedded therein (not illustrated). The thermally conductive material of the phosphor layer 161 may be aluminum nitride, for example. As a result, the heat generated may already be distributed in the phosphor layer 161.

Heat spreading may be brought about with the aid of the thermally conductive layer 163 of the conversion element 160, the thermally conductive layer being thermally coupled to the phosphor layer 161 via the reflective layer 162. This effect may be fostered by virtue of the frame shape of the thermally conductive layer 163, whereby the point or region where heat arises may be laterally enclosed. The thermally conductive layer 163 may furthermore provide for heat transfer from the phosphor layer 161 to an adjoining heat sink, i.e. in the present case to the mounting section 142 and thus the rest of the base part 140. To achieve a high efficiency, the thermally conductive layer 163 may be formed from a material having a high thermal conductivity, for example, from a metallic material such as copper, for example. Efficient dissipation of heat may furthermore be fostered by virtue of the fact that the conversion element 160 comprises a soldering surface 167 and is secured to the mounting section 142 via a soldering connection.

Production (not illustrated) of the laser component 100 shown in FIG. 1, wherein (for the case of use of a TO housing 130) already existing and hence cost-effective production techniques may be employed, may be carried out as follows. In this case, component parts of the laser component 100, i.e. the housing parts 140, 150, the laser chip 110, the chip carrier 120 and the conversion element 160, are provided and assembled.

To provide the conversion element 160, a ceramic layer element comprising the thermally conductive material with one or a plurality of phosphors embedded therein may be produced, which is subsequently divided into a plurality of rectangular or parallelepipedal phosphor layers 161. Each of the phosphor layers 161 may be used to produce a dedicated conversion element 160. Such a phosphor layer 161 may be coated with the reflective layer 162 on a side facing the laser chip 110 in the laser component 100 to be produced. Afterward, the frame-shaped thermally conductive layer 163 may be formed on the reflective layer 162. This may comprise carrying out a sputtering method. The soldering surface 167 may subsequently be formed on the thermally conductive layer 163.

The laser chip 110 may be arranged on the chip carrier 120 by soldering. Arranging the chip carrier 120 on the mounting section 142 of the base part 140, which may be carried out after arranging the laser chip 110 on the chip carrier 120, may be carried out by soldering. In the same way, the conversion element 160 may be soldered onto the mounting section 142.

At the end of the production method, connecting the cap 150 to the base part 140 may be carried out. A welding method may be carried out for this purpose. Beforehand or prior to capping, the terminal pins 141 may furthermore be electrically connected to the laser chip 110. A wire bonding process in which, as indicated above, corresponding electrical connections via bond wires are formed may be carried out for this purpose.

A description is given below of possible variants and modifications that may be taken into consideration for a laser component 100, for the constituents thereof and for a production method. Corresponding features and advantages and also identical and identically acting component parts are not described in detail again below. For details in respect thereof, reference is instead made to the description above. Furthermore, aspects and details mentioned in relation to one configuration of a laser component 100 may also be applied in relation to another configuration and features of two or a plurality of configurations may be combined with one another.

One possible modification consists, for example, in arranging a conversion element 160 on a chip carrier 120. To elucidate such a design, FIG. 3 shows a schematic lateral illustration of a further laser component 100. The laser component 100 comprises a chip carrier 120, on which are arranged a laser chip 110 to generate and emit a laser radiation 190 and also a conversion element 160 for radiation conversion, the conversion element being irradiatable with the laser radiation 190. The laser chip 110 is situated on a mounting side of the chip carrier 120. At this point a contact pad of the laser chip 110 may connect to a mating contact pad of the chip carrier 120 via a solder (not illustrated).

As shown in FIG. 3, the conversion element 160 is arranged on an end side of the chip carrier 120 oriented perpendicularly to the mounting side. The conversion element 160 comprising a phosphor layer 161, a reflective layer 162 and a thermally conductive layer 163, has a metallic soldering surface 167 at this point (cf. FIG. 2). The chip carrier 120 may have on the end side a metallic coating coordinated therewith such that the conversion element 160 may be secured on the chip carrier 120 via a soldering connection (not illustrated). On the end side of the chip carrier 120 or proceeding therefrom, the conversion element 160 projects relative to the chip carrier 120 such that the conversion element 160 may be irradiated with the laser radiation 190 on a side facing the laser chip 110.

FIG. 3 furthermore shows that the laser chip 110 is arranged with a longitudinal side 111 on the chip carrier 120, near which longitudinal side the laser radiation 190 is emitted via an emission facet 115 (p-down construction). To avoid shading of the laser radiation 190, the chip carrier 120 illustrated in FIG. 3, in a departure from the chip carrier 120 from FIG. 1, which has a rectangular cross-sectional shape, has a laterally projecting shoulder 125 and thus a stepped shape in cross section. This configuration makes it possible to mount the laser chip 110 on the chip carrier 120 such that the laser chip 110 in the region of the shoulder 125 with the emission facet 115 projects laterally relative to the mounting side of the chip carrier 120. The end side of the chip carrier 120 on which the conversion element 160 is arranged is formed by the shoulder 125.

In the laser component 100 from FIG. 3, too, the chip carrier 120 is arranged on a mounting section 142 of a base part 140. In this case, the chip carrier 120 may serve as a common heat sink for the laser chip 110 and for the conversion element 160. During operation of the laser component 100, heat generated in these component parts 110, 160 may be dissipated via the chip carrier 120, the mounting section 142 adjoining the latter, and the rest of the base part 140. With regard to the conversion element 160, the thermally conductive layer 163 may provide for heat transfer from the phosphor layer 161 to the chip carrier 120.

In the laser component 100 from FIG. 3, the joint arrangement of the laser chip 110 and the conversion element 160 on the chip carrier 120 affords the possibility of providing a small or minimal distance between the laser chip 110 and the conversion element 160. During operation of the laser component 100, it is possible to provide a high or maximum power density on the conversion element 160 in this way. Consequently, the laser component 100 may be distinguished by a relatively high luminance.

In the context of the production of the laser component 100 from FIG. 3, the laser chip 110 and the conversion element 160 may be arranged on the chip carrier 120 by soldering. Afterward, the chip carrier 120 may be secured on the mounting section 142, likewise by soldering. Further steps from among those mentioned above (wire bonding, capping) may be carried out to complete the laser component 100.

With regard to the laser component 100 from FIG. 3, it is possible to carry out test operation including an optical measurement as early as after arranging the laser chip 110 and the conversion element 160 on the chip carrier 120, that is to say a measurement at the COSA level. With regard to production of a plurality of laser components 100, in this way it is possible to identify defective components in an earlier method stage and it is thereby possible to achieve a higher yield.

The abovementioned aspects may be correspondingly applied in the laser component 100 from FIG. 4. The laser component 100 comprises a chip carrier 120 having a rectangular cross-sectional shape, a laser chip 110 to generate a laser radiation 190 and a conversion element 160 being arranged on the chip carrier. The laser chip 110 is situated on a mounting side and the conversion element 160 is situated on an end side of the chip carrier 120 oriented perpendicularly to the mounting side. The laser chip 110 is positioned at a small or minimal distance from the conversion element 160. The conversion element 160 proceeding from the end side projects relative to the chip carrier 120 such that the conversion element 160 may be irradiated with the laser radiation 190 on a side facing the laser chip 110.

In the laser component 100 from FIG. 4, shading of a laser radiation 190 emitted by the laser chip 110 via an emission facet 115 is avoided as follows. The laser chip 110 is arranged on the chip carrier 120 not with a longitudinal side 111 near which the radiation emission takes place, but rather with a longitudinal side 112 opposite thereto. At this point a contact pad of the laser chip 110 may connect to a mating contact pad of the chip carrier 120 via a solder (not illustrated). In accordance with the above-indicated orientation of p- and n-doped semiconductor regions of the laser chip 110, this construction may be characterized by the designation p-up.

Figure 5:
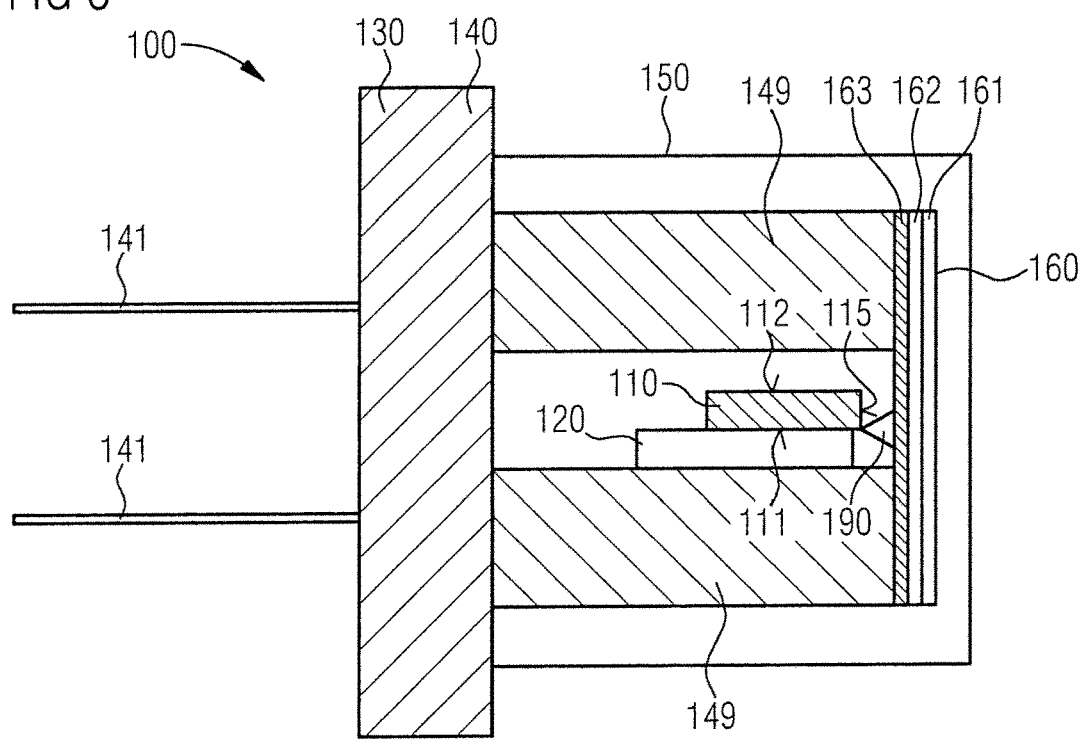
FIG. 5 shows a lateral illustration of a further laser component comprising two thermally conductive holding parts arranged on a base part, wherein a conversion element is arranged on both of the holding parts and a chip carrier carrying a laser chip is arranged on one holding part.

FIG. 5 shows a schematic lateral illustration of a further laser component 100. The laser component 100 comprises a base part 140 with terminal pins 141. In contrast to the configuration shown in FIGS. 1, 3, 4, the base part 140 from FIG. 5 does not comprise a mounting section 142. Instead, a plurality of thermally conductive holding parts 149, i.e. two thereof in the present case, are arranged on the base part 140. The holding parts 149 may be configured in a parallelepipedal fashion. Furthermore, the holding parts 149 may comprise a thermally conductive ceramic material such as, for example, silicon carbide and a metallic coating (not illustrated). The base part 140 is connected to a cap 150 that may comprise an exit window (not shown) on a side facing away from the base part 140.

As is furthermore illustrated in FIG. 5, a chip carrier 120 provided with a laser chip 110 is arranged on one of the holding parts 149. This involves the same COSA design such as is shown in FIG. 1 and described above. The chip carrier 120 may be secured on the holding part 149 via a soldering connection (not illustrated).

In the laser component 100 from FIG. 5, a conversion element 160 used for radiation conversion is arranged on the two thermally conductive holding parts 149 or on end sides of the two holding parts 149. As a result, the conversion element 160 covers an interspace between the holding parts 149 in which the laser chip 110 is situated. During operation of the laser component 100, the conversion element 160 may in this way be irradiated with a laser radiation 190 emitted by the laser chip 110 on a side facing the laser chip 110.

Figure 6:
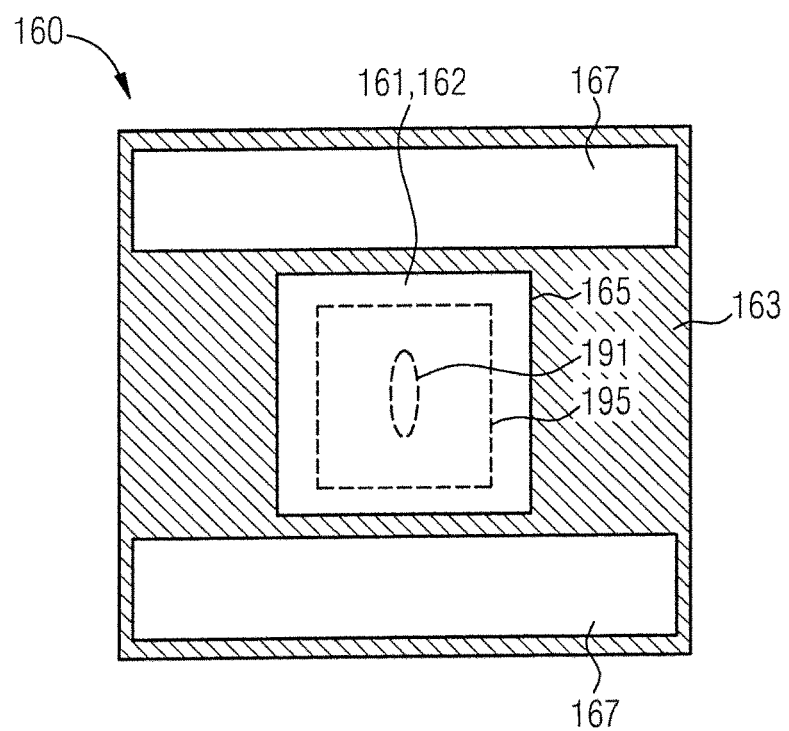
FIG. 6 shows a plan view illustration of the conversion element from FIG. 5 with two soldering surfaces.

The conversion element 160 of the laser component 100 from FIG. 5, too, comprises a ceramic phosphor layer 161, a reflective layer 162 arranged on the phosphor layer 161, and a thermally conductive layer 163 arranged on the reflective layer 162. With reference to FIG. 6, which shows a plan view illustration of the conversion element 160 when viewing the side facing the laser chip 110, it becomes clear that the thermally conductive layer 163 once again comprises a frame-shaped configuration having an opening 165. In the region of the opening 165, the reflective layer 162 and thus the phosphor layer 161 may be irradiated with the laser radiation.

With the aid of dashed lines, FIG. 6 furthermore illustrates a region 191 irradiated with the laser radiation 190, and an active region 195 of the conversion element 160. FIG. 6 furthermore shows that the conversion element 160 comprises two soldering surfaces 167 arranged on the thermally conductive layer 163. In this way, the conversion element 160 may connect to the thermally conductive holding parts 149 with the aid of the soldering surfaces 167 and via a solder (not illustrated).

During operation of the laser component 100 from FIG. 5, heat generated in the laser chip 110 may be dissipated via the chip carrier 120 and furthermore via the holding part 149 adjoining the latter, and via the base part 140. Heat may be dissipated from the conversion element 160 via the two holding parts 149 and furthermore via the base part 140. In this case, the thermally conductive layer 163 of the conversion element 160 may provide for heat transfer from the phosphor layer 161 to the holding parts 149. On account of the configuration of the laser component 100 comprising the two holding parts 149, efficient dissipation of heat from the conversion element 160 is possible.

To produce the laser component 100 shown in FIG. 5, the housing parts 140, 150, the thermally conductive holding parts 149, the laser chip 110, the chip carrier 120 and the conversion element 160 are provided. The further assembly of these component parts may be carried out as follows.

The laser chip 110 may be arranged on the chip carrier 120. Afterward, the chip carrier 120 provided with the laser chip 110 may be mounted on a holding part 149, and the relevant holding part 149 may subsequently be secured on the base part 140 such that the state shown in FIG. 7 is present. A soldering process may each be carried out in these steps.

Afterward, the terminal pins 141 arranged on the base part 140 may electrically connect to the laser chip 110. A wire bonding process in which corresponding electrical connections via bond wires are produced (not illustrated) may be carried out for this purpose. In this case, one terminal pin 141 may connect to a contact pad on a longitudinal side 112 of the laser chip 110 via a bond wire. The other terminal pin 141 may connect to a mating contact pad of the chip carrier 120 via a further bond wire, wherein the mating contact pad electrically connects to a contact pad on a longitudinal side 111 of the laser chip 110.

Afterward, as shown in FIG. 8, the other holding part 149 may be arranged on the base part 140 by soldering. After that, as shown in FIG. 9, the conversion element 160 may be soldered onto the holding parts 149. To complete the laser component 100 from FIG. 5, the base part 140 may furthermore connect to the cap 150.

Alternatively, the state shown in FIG. 8 may be omitted by a procedure in which the conversion element 160 is pre-mounted on a holding part 149 and, jointly, the holding part 149 is secured on the base part 140 and the conversion element 160 is secured on the holding part 149 already situated on the base part 140.

FIG. 10 shows a schematic lateral illustration of a further laser component 100 comprising thermally conductive holding parts 149 arranged on a base part 140. In contrast to the configuration shown in FIG. 5, a laser chip 110 is arranged directly on one of the holding parts 149 in the laser component 100 from FIG. 10. The relevant holding part 149 therefore serves as a chip carrier. The laser chip 110 is mounted on the holding part 149 with a longitudinal side 112 opposite to a longitudinal side 111 in the vicinity of which a laser radiation 190 is emitted from the laser chip 110 via an emission facet 115. A p-up construction may thus be present. This prevents the laser radiation 190 from being shaded by the holding part 149.

The holding part 149 carrying the laser chip 110 has a metallic mating contact pad electrically connected to a contact pad on the longitudinal side 112 of the laser chip 110. In this configuration, too, the mating contact pad electrically connects to a terminal pin 141 of the base part 140, for example, via a bond wire (respectively not illustrated).

Heat generated in the laser chip 110 during operation may be dissipated via the holding part 149 adjoining the latter, and via the base part 140. The direct arrangement of the laser chip 110 on the holding part 149 makes possible, compared to the use of a chip carrier 120 as shown in FIG. 5, improved dissipation of heat. Furthermore, a cost saving may be achieved. Production of the laser component 100 from FIG. 10 may be carried out in a manner comparable to production of the laser component 100 from FIG. 5, wherein the laser chip 110 is arranged directly on one of the holding parts 149.

In the above-described laser components 100 shown in FIGS. 1, 3, 4, 5 and 10, a light radiation may be emitted in scattered form by a conversion element 160 and thus via an exit window of a cap 150. However, consideration may also be given to configurations of laser components 100 comprising an integrated optical element to achieve beam shaping.

For elucidation, FIG. 11 shows a schematic lateral illustration of a further laser component 100 constituting a development of the laser component 100 from FIG. 1. The laser component 100 from FIG. 11 comprises a cap 150 having a lens 159, serving as an exit window, on a side facing away from the base part 140. It is thereby possible to focus the light radiation emitted by the associated conversion element 160. A beam of rays emitted by the laser component 100 may have a low divergence in this way. In the context of producing the laser component 100, the cap 150 having the integrated lens 159 may be provided.

On account of the integrated lens 159, the laser component 100 from FIG. 11 may be used in a device or a system, for example, a headlight, wherein a use of additional optical elements may be obviated (not illustrated). Consequently, a compact design at the system level is possible.

Figure 12:
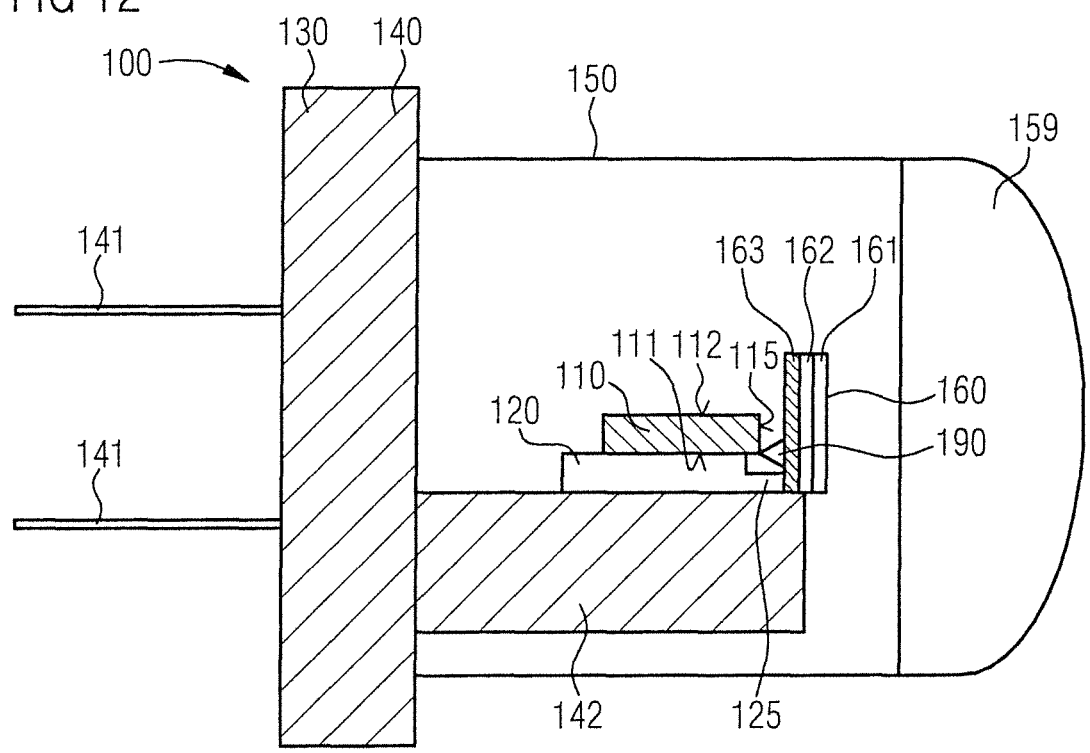
FIG. 12 shows a lateral illustration of a further laser component comprising a cap comprising a lens.

Configurations comprising a cap 150 having an integrated lens 159 may likewise be realized for the laser components 100 shown in FIGS. 3, 4, 5 and 10. With respect to FIG. 3, such a configuration of a laser component 100 is shown, for example, in FIG. 12.

Figure 13:
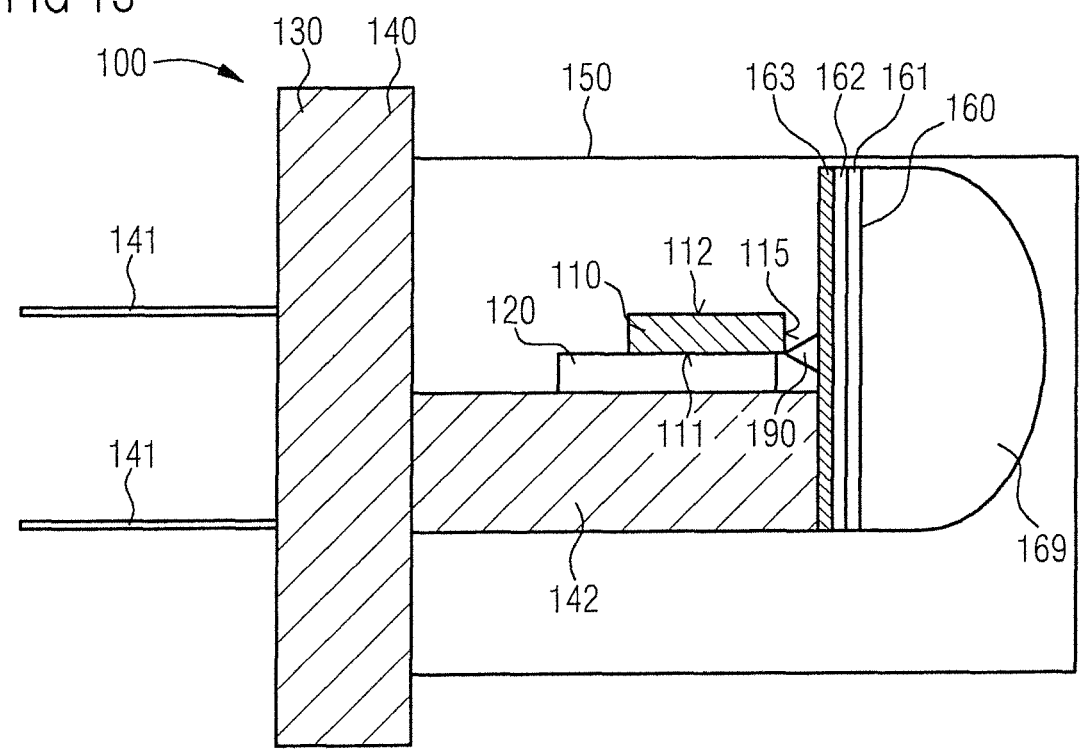
FIG. 13 shows a lateral illustration of a further laser component comprising a conversion element comprising a lens.

FIG. 13 shows a schematic lateral illustration of a further laser component 100 likewise constituting a development of the laser component 100 from FIG. 1. The laser component 100 from FIG. 13 comprises a conversion element 160 comprising a phosphor layer 161, a reflective layer 162, a thermally conductive layer 163 and an additional lens 169.

The lens 169 of the conversion element 160 is arranged on a side of the phosphor layer 161 facing away from a laser chip 110 of the laser component 100. This configuration likewise makes it possible to focus the light radiation emitted by the conversion element 160 such that a beam of rays emitted by the laser component 100 may have a low divergence.

The lens 169 may be mounted on the phosphor layer 161 in the context of producing the laser component 100 or in the context of providing the conversion element 160. On account of the lens 169, the laser component 100 may be used without additional optical elements in a device or a system, such that a compact design at the system level is possible in this configuration, too.

A cap 150 of the laser component 100 from FIG. 13 may have the above-described design comprising an exit window on a side facing away from a base part 140 (not illustrated). The light radiation which is generated in the laser component 100 with the aid of the laser chip 110 and the phosphor layer 161, passes through the lens 169 and is focused with the aid of the lens 169 may be emitted via the exit window.

Figure 14:
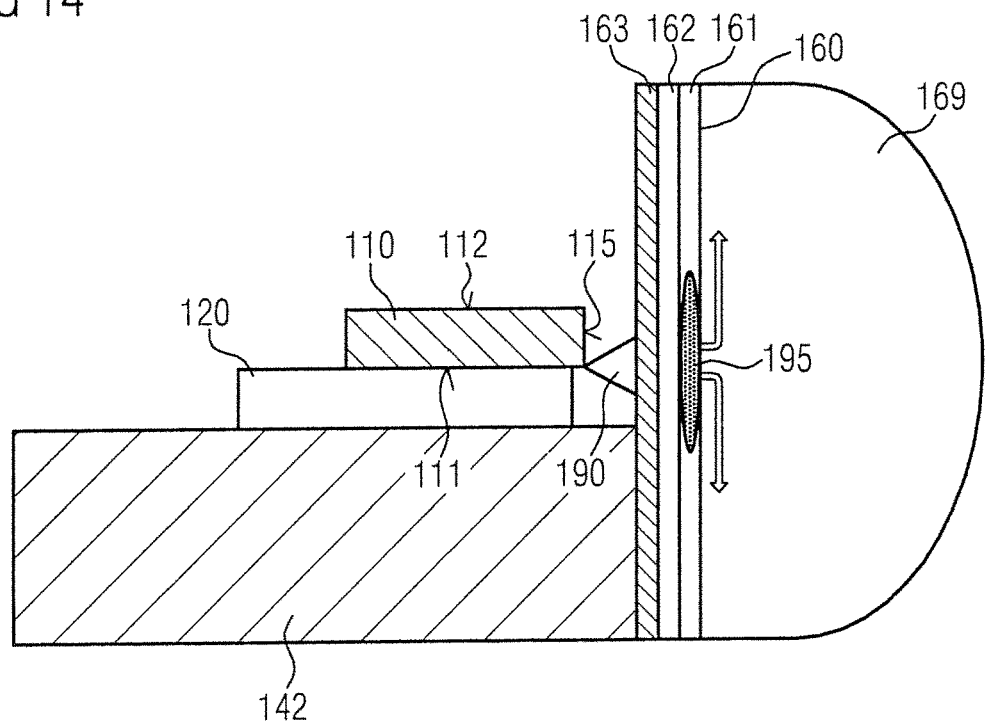
FIG. 14 shows an enlarged illustration of component parts of the laser component from FIG. 13, wherein heat dissipation via the lens is indicated.

A further advantage that may be achieved with the aid of the integrated lens 169 is improved dissipation of heat from the conversion element 160. In this context, FIG. 14 shows an enlarged illustration of component parts of the laser component 100 from FIG. 13. FIG. 14 additionally illustrates an active region 195, in which the radiation conversion in the phosphor layer 161 and hence the light emission from the phosphor layer 161 may take place. The lens 169 arranged on the phosphor layer 161 enables additional heat dissipation, as is indicated with the aid of arrows in FIG. 14. Consequently, in this configuration, cooling of the active region 195 may be fostered and improved thermal management is possible.

Figure 15:
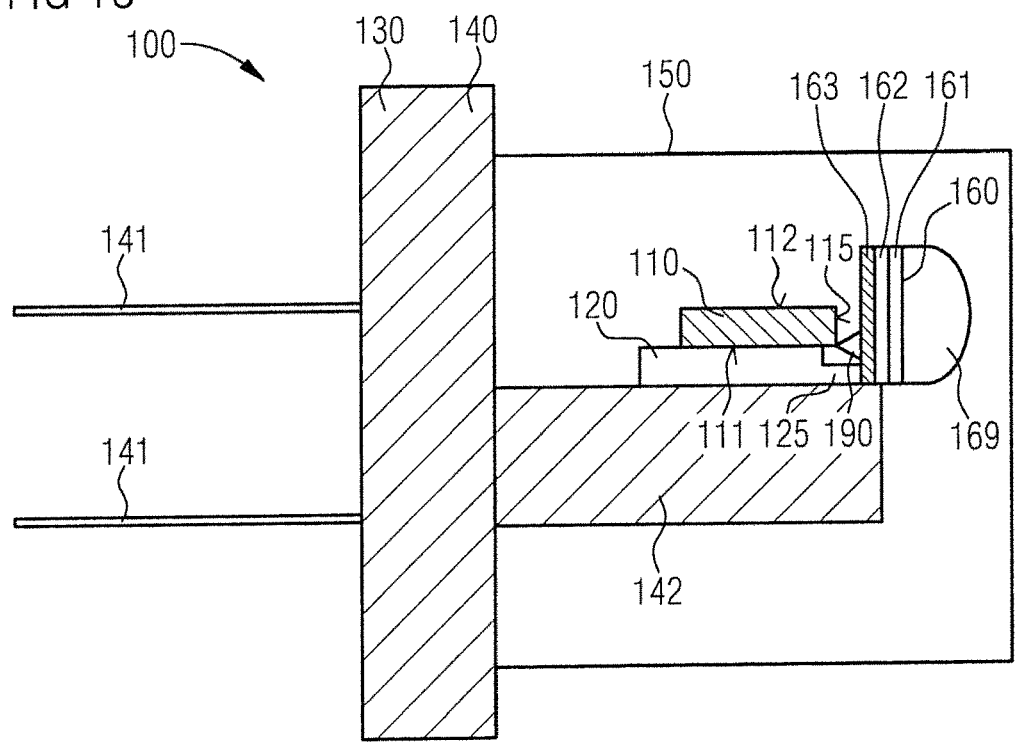
FIG. 15 shows a lateral illustration of a further laser component comprising a conversion element comprising a lens.

For the laser components 100 shown in FIGS. 3, 4, 5 and 10, it is possible to realize corresponding configurations by employing a conversion element 160 with an integrated lens 169. With respect to FIG. 3, such a design of a laser component 100 is shown, for example, in FIG. 15.

Figure 16:
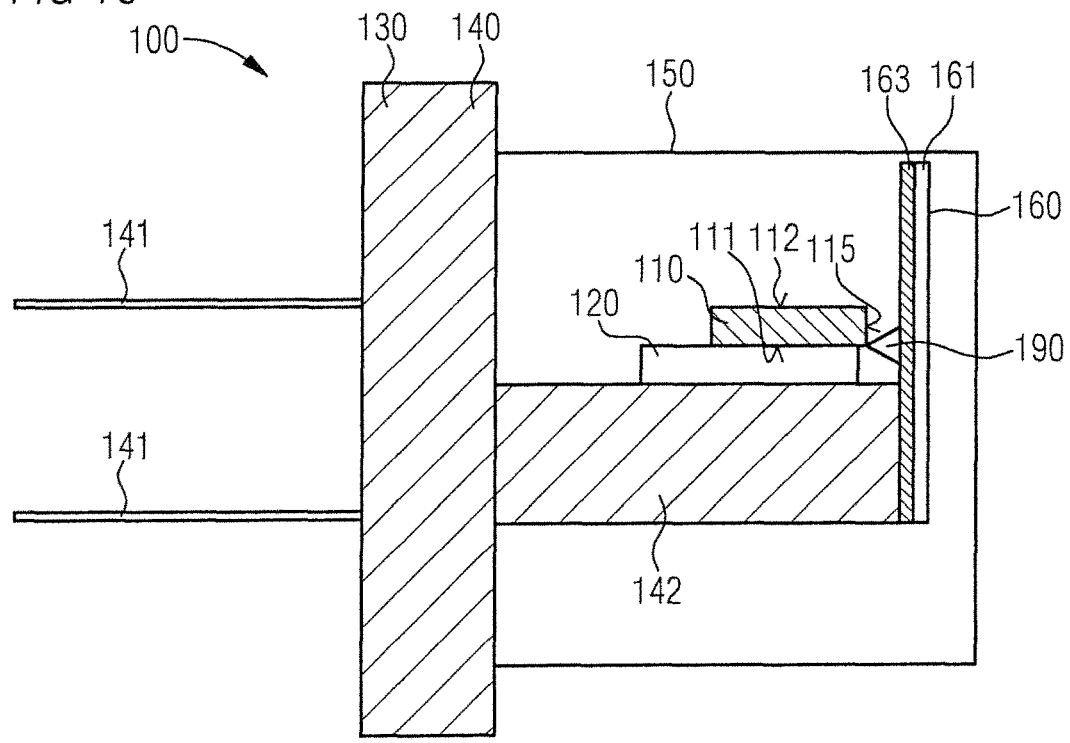
FIG. 16 shows a lateral illustration of a further laser component comprising a conversion element comprising a thermally conductive layer arranged on a phosphor layer.

FIG. 16 shows a schematic lateral illustration of a further laser component 100, which constitutes a further modification of the laser component 100 from FIG. 1. The laser component 100 from FIG. 16 comprises a conversion element 160 comprising a phosphor layer 161, a reflective layer 162 (not shown in FIG. 16) and a thermally conductive layer 163. The thermally conductive layer 163 is arranged directly on the phosphor layer 161, i.e. on a side of the phosphor layer 161 facing a laser chip 110 of the laser component 100. This also applies to the reflective layer 162. The thermally conductive layer 163 comprises a frame-shaped configuration having an opening 165, as shown in FIG. 2. The reflective layer 162 is arranged on the phosphor layer 161 within the opening 165 of the thermally conductive layer 163. In the course of providing the conversion element 160, which is carried out in the context of the production of the laser component 100, the two layers 162, 163 may be formed successively on the phosphor layer 161.

Figure 17:
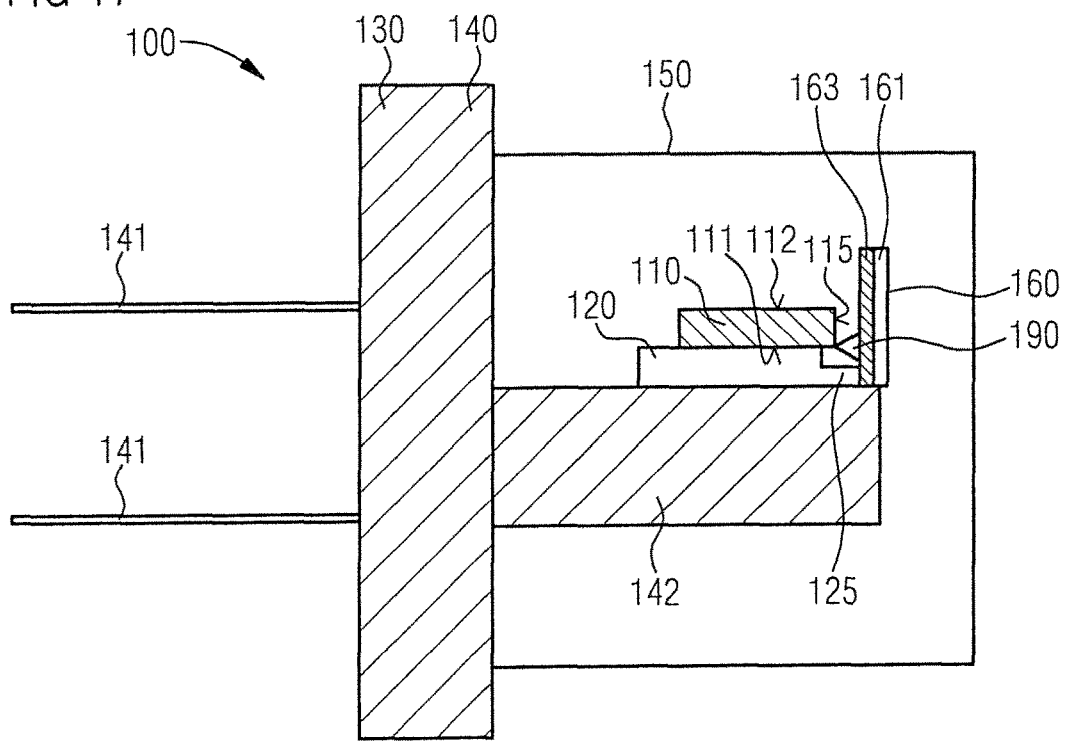
FIG. 17 shows a lateral illustration of a further laser component comprising a conversion element comprising a thermally conductive layer arranged on a phosphor layer.

The configuration described above may correspondingly be taken into consideration with regard to the conversion elements 160 of the laser components 100 shown in FIGS. 3, 4, 5, 10, 11, 12, 13 and 15. With respect to FIG. 3, such an example is indicated, for example, in FIG. 17.

Figure 18:
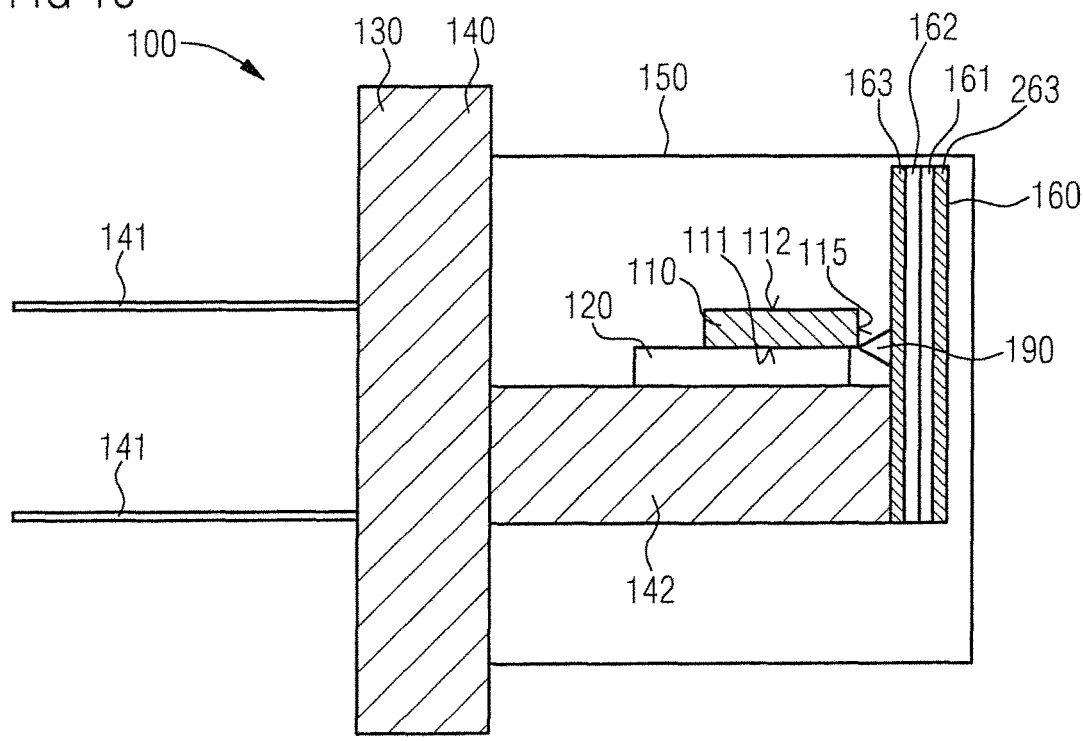
FIGS. 18 and 19 show lateral illustrations of further laser components comprising a conversion element comprising a thermally conductive layer and a further thermally conductive layer.

FIG. 18 shows a schematic lateral illustration of a further laser component 100 constituting a further modification of the laser component 100 from FIG. 1. The laser component 100 from FIG. 18 comprises a conversion element 160 comprising a phosphor layer 161, a reflective layer 162, a thermally conductive layer 163 and a further thermally conductive layer 263. By the further thermally conductive layer 263, additional heat dissipation may be made possible and efficient dissipation of heat from the phosphor layer 161 may be fostered as a result.

As shown in FIG. 18, the thermally conductive layer 163 and the further thermally conductive layer 263 are situated on opposite sides of the conversion element 160, i.e. on a side which faces a laser chip 110 of the laser component 100 and is irradiatable with the laser radiation 190 of the laser chip 110, and on a side of the conversion element 160 which is opposite thereto and is used for light emission. The phosphor layer 161 is arranged between the thermally conductive layer 163 and the further thermally conductive layer 263.

Apart from the additional thermally conductive layer 263, the construction of the conversion element 160 of the laser component 100 from FIG. 18 corresponds to the conversion element 160 of the laser component 100 from FIG. 1. The reflective layer 162 is situated on a side of the phosphor layer 161 facing the laser chip 110. The thermally conductive layer 163 is arranged on the reflective layer 162. The thermally conductive layer 163 has the configuration shown in FIG. 2, i.e. a frame-shaped configuration having an opening 165, such that the reflective layer 162 and the phosphor layer 161 may be irradiated with laser radiation 190 of the laser chip 110 in this region.

As shown in FIG. 18, the further thermally conductive layer 263 is arranged directly on the phosphor layer 161, i.e. on a side of the phosphor layer 161 facing away from the laser chip 110. The further thermally conductive layer 263 is configured in a manner corresponding to the thermally conductive layer 163. In this sense, the further thermally conductive layer 263 is formed from a material having a high thermal conductivity, for example, from a metallic material such as copper, for example. Moreover, the further thermally conductive layer 263 has a configuration corresponding to FIG. 2, i.e. a frame-shaped configuration having an opening (not illustrated). In this way, light may be emitted from the conversion element 160 via the opening of the further thermally conductive layer 263. Forming the further thermally conductive layer 263 in the context of providing the conversion element 160 may comprise, in a manner corresponding to the other thermally conductive layer 163, carrying out a sputtering method.

The above-described configuration comprising two thermally conductive layers 163, 263 may correspondingly be taken into consideration with regard to the conversion elements 160 of the laser components 100 shown in FIGS. 3, 4, 5, 10, 11, 12, 13 and 15. With respect to the laser components 100 shown in FIGS. 13 and 15, a further thermally conductive layer 263 may be arranged on the side of the phosphor layer 161 facing away from the laser chip 110, and a lens 169 may be arranged on the further thermally conductive layer 263.

Furthermore, it is possible to use conversion elements 160 comprising two thermally conductive layers 163, 263 in the case of which, rather than just one, both thermally conductive layers 163, 263 are arranged directly on a phosphor layer 161.

Figure 19:
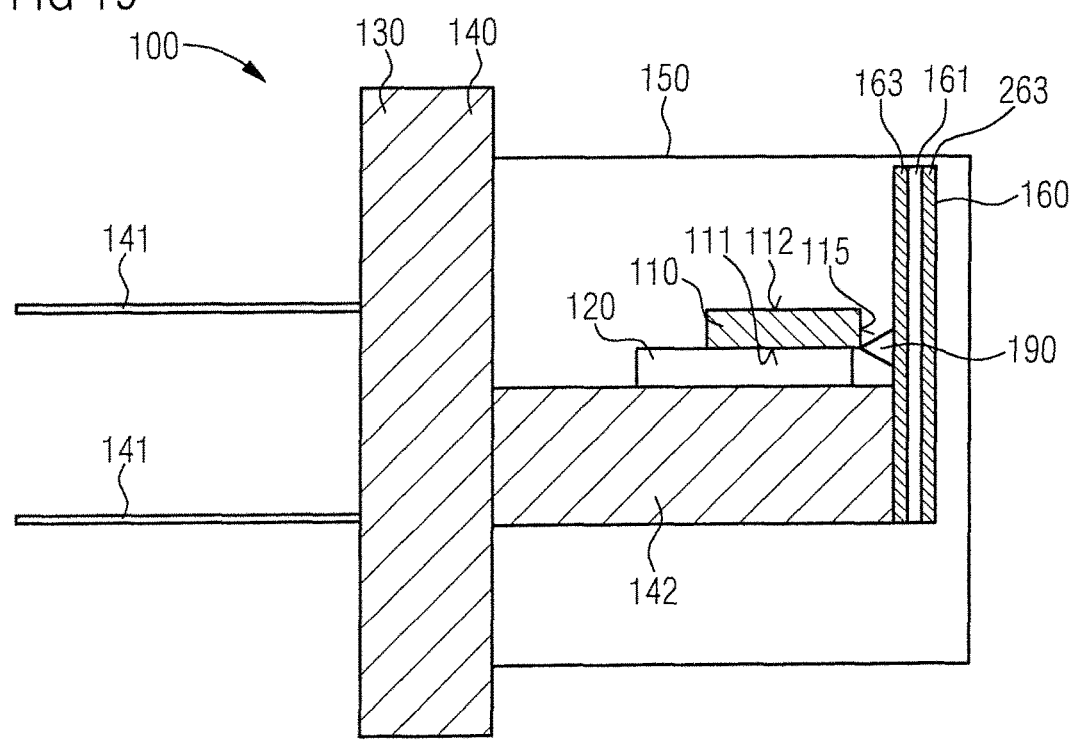

For exemplary elucidation, FIG. 19 shows a schematic lateral illustration of a further laser component 100 constituting a modification of the laser component 100 from FIG. 16. The laser component 100 from FIG. 19 comprises a conversion element 160 comprising a phosphor layer 161, a reflective layer 162 (not shown in FIG. 19), a thermally conductive layer 163 and a further thermally conductive layer 263. The thermally conductive layer 163 and the further thermally conductive layer 263 are situated on opposite sides of the conversion element 160. The phosphor layer 161 is arranged between the thermally conductive layer 163 and the further thermally conductive layer 263.

As shown in FIG. 19, the thermally conductive layer 163 is arranged directly on the phosphor layer 161, i.e. on a side of the phosphor layer 161 facing a laser chip 110 of the laser component 100. This also applies to the reflective layer 162. The thermally conductive layer 163 comprises a frame-shaped configuration having an opening 165, as shown in FIG. 2. The reflective layer 162 is arranged on the phosphor layer 161 within the opening 165 of the thermally conductive layer 163.

The further thermally conductive layer 263 is likewise arranged directly on the phosphor layer 161, i.e. on a side of the phosphor layer 161 facing away from the laser chip 110, as is shown in FIG. 19. The further thermally conductive layer 263 comprises, analogously to the thermally conductive layer 163, a frame-shaped configuration having an opening corresponding to FIG. 2 (not illustrated).

The above-described configuration comprising two thermally conductive layers 163, 263 arranged directly on a phosphor layer 161 may correspondingly be taken into consideration with regard to the conversion elements 160 of the laser components 100 shown in FIGS. 3, 4, 5, 10, 11, 12, 13 and 15. With respect to the laser components 100 shown in FIGS. 13 and 15, a further thermally conductive layer 263 may be arranged on the side of the phosphor layer 161 facing away from the laser chip 110, and a lens 169 may be arranged on the further thermally conductive layer 263.

Besides the examples depicted and described above, further examples are possible, which may comprise further modifications and/or combinations of features.

With respect to the examples explained with reference to FIGS. 11 to 15, it is possible, for example, to use other optical elements for beam shaping instead of the lenses 159, 169. These include, for example, optical elements comprising a microlens array or a microprism array.

Furthermore, it is possible to realize laser components 100 which comprise a conversion element 160 having an integrated optical element and also a cap 150 having an integrated optical element.

With regard to laser components 100 comprising a base part 140 without a mounting section 142 such as are shown in FIGS. 5 to 10, consideration may be given to alternative configurations comprising a different or larger number of thermally conductive holding parts 149 arranged on a base part 140. In this case, a conversion element 160 may be arranged on the plurality of holding parts 149, and a chip carrier 120 provided with a laser chip 110 or a laser chip 110 may be arranged on one of the holding parts 149. Furthermore, a configuration comprising, for example, only one thermally conductive holding part 149 arranged on a base part 140 is possible, a conversion element 160 and a chip carrier 120 provided with a laser chip 110 or a laser chip 110 being arranged on the holding part.

Furthermore, the configurations described above are not restricted to laser components 100 comprising a single emitter, that is to say comprising a single laser chip 110. Consideration may furthermore be given to laser components 100 having a comparable construction comprising a plurality of emitters or laser chips 110 arranged in a housing 130 and serving for irradiating an integrated conversion element 160.

In this context, it is possible, for example, for each laser chip 110 to be arranged on a dedicated chip carrier 120. Alternatively, it is possible to provide a common chip carrier 120 for a plurality of laser chips 110. The chip carriers 120 or the common chip carrier 120 may be arranged on a mounting section 142 of a base part 140. The conversion element 160 may also be mounted on the mounting section 142. Alternatively, the conversion element 160 may be arranged on the plurality of chip carriers 120 or on the common chip carrier 120. Furthermore, a base part 140 without a mounting section 142 may be employed, on which a plurality of thermally conductive holding parts 149 are arranged. In this case, the chip carriers 120 or the common chip carrier 120 may be arranged on one of the holding parts 149. The use of one or a plurality of chip carriers 120 may also be obviated. In this case, a plurality of laser chips 110 may be arranged directly on one of the holding parts 149. Laser components 100 comprising a plurality of laser chips 110 may have, as viewed from the side, a construction corresponding to FIGS. 1, 3, 4, 5, 10, 11, 12, 13, 15, 16, 17, 18, 19. In this case, the plurality of laser chips 110 may be arranged alongside one another perpendicularly to the plane of the drawing in the relevant figures.

A further possible modification may be taken into consideration with respect to a thermally conductive layer 163, 263 of a conversion element 160. Apart from a metal, such a layer may be formed from some other material, for example, ceramic, diamond, sapphire, or a basic or matrix material with embedded carbon nanotubes.

Although our components and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2016 113 470.8, the subject matter of which is incorporated herein by reference.

The invention claimed is:

1. A laser component comprising:
   a housing;
   a laser chip arranged in the housing; and
   a conversion element for radiation conversion arranged in the housing, wherein the conversion element is irradiatable with laser radiation of the laser chip,
   wherein the conversion element comprises 1) a phosphor layer, 2) a thermally conductive layer that dissipates heat from the phosphor layer, and 3) a reflective layer,
   the phosphor layer is irradiatable with laser radiation of the laser chip via the reflective layer, and
   the reflective layer is configured such that the laser radiation is transmitted by the reflective layer, thereby introduced into the phosphor layer and at least partly converted, and such that the reflective layer provides for reflection of conversion radiation generated in the phosphor layer,
   both the reflective layer and the thermally conductive layer are directly arranged on a side of the phosphor layer facing the laser chip,
   the phosphor layer is partly concealed by the thermally conductive layer, and
   the reflective layer is arranged in a region on the phosphor layer in which the phosphor layer is not concealed by the thermally conductive layer.

2. The laser component according to claim 1, wherein at least one of the following is present:
   the phosphor layer comprises a thermally conductive material with one phosphor or a plurality of phosphors embedded therein, the thermally conductive layer is forming from one selected from the group consisting of metal, ceramic, diamond, sapphire, and matrix material with embedded carbon nanotubes, the conversion element is configured in a plate-shaped fashion and comprises a planar configuration, and/or the conversion element comprises a side facing the laser chip and is irradiatable with the laser radiation of the laser chip, and a side opposite thereto for light emission.

3. The laser component according to claim 1, wherein the phosphor layer is irradiatable with laser radiation of the laser chip in a region in which the phosphor layer is not concealed by the thermally conductive layer.

4. The laser component according to claim 1, wherein the thermally conductive layer comprises a frame-shaped configuration having an opening, and the phosphor layer is irradiatable with laser radiation of the laser chip via the opening of the thermally conductive layer.

5. The laser component according to claim 1, wherein the conversion element comprises a further thermally conductive layer, and the phosphor layer is arranged between the thermally conductive layer and the further thermally conductive layer.

6. The laser component according to claim 1, wherein the housing comprises a base part and a cap connected to the base part.

7. The laser component according to claim 6, wherein the base part comprises a projecting mounting section.

8. The laser component according to claim 7, wherein the conversion element is arranged on the mounting section, the conversion element comprises a soldering pad configured in the form of a metallic layer and arranged on the thermally conductive layer, and the conversion element mechanically and thermally connects to the mounting section with the aid of the soldering pad and by a solder such that the conversion element is directly secured to the mounting section via a soldering connection.

9. The laser component according to claim 7, wherein the laser chip is arranged on a chip carrier, and the chip carrier is arranged on the mounting section.

10. The laser component according to claim 9, wherein the conversion element is arranged on the chip carrier, the conversion element comprises a soldering pad configured in the form of a metallic layer and arranged on the thermally conductive layer, and the conversion element mechanically and thermally connects to the chip carrier with the aid of the soldering pad and by a solder such that the conversion element is directly secured to the chip carrier via a soldering connection.

11. The laser component according to claim 6, further comprising a plurality of thermally conductive holding parts arranged on the base part, wherein the conversion element is arranged on the plurality of holding parts, wherein the conversion element comprises a plurality of soldering pads each configured in the form of a metallic layer and arranged on the thermally conductive layer, and the conversion element mechanically and thermally connects to the holding parts with the aid of the soldering pads and by a solder such that the conversion element is directly secured to each of the holding parts via a soldering connection.

12. The laser component according to claim 1, wherein the conversion element comprises a radiation-transmissive optical element, and/or a cap of the housing, said cap connected to a base part of the housing comprising a radiation-transmissive optical element.

13. A method of producing the laser component according to claim 1, comprising:

providing component parts of the laser component comprising a laser chip, a conversion element for radiation conversion and housing parts; and assembling the component parts of the laser component such that a housing is provided within which the laser chip and the conversion element are arranged, wherein the conversion element is irradiatable with laser radiation of the laser chip.

14. The laser component according to claim 1, wherein the thermally conductive layer comprises a frame-shaped configuration having an opening and the reflective layer is arranged on the phosphor layer within the opening of the thermally conductive layer.

15. A laser component comprising:

a housing, a laser chip arranged in the housing, and a conversion element for radiation conversion arranged in the housing, wherein the conversion element is irradiatable with laser radiation of the laser chip, wherein the conversion element comprises 1) a phosphor layer, 2) a thermally conductive layer that dissipates heat from the phosphor layer, and 3) a further thermally conductive layer that dissipates heat from the phosphor layer, the phosphor layer is arranged between the thermally conductive layer and the further thermally conductive layer, both the thermally conductive layer and the further thermally conductive layer comprise a frame-shaped configuration having an opening, the phosphor layer is irradiatable with laser radiation of the laser chip via the opening of the thermally conductive layer, and light emission may take place via the opening of the further thermally conductive layer.

16. A laser component comprising:

a housing;

a laser chip arranged in the housing; and a conversion element for radiation conversion arranged in the housing, wherein the conversion element is irradiatable with laser radiation of the laser chip, wherein the housing comprises a base part and a cap connected to the base part, a plurality of thermally conductive holding parts are arranged on the base part, the conversion element is arranged on the plurality of holding parts, the conversion element comprises a plurality of soldering pads each configured in the form of a metallic layer, and the conversion element mechanically and thermally connects to the holding parts with the aid of the soldering pads and by a solder such that the conversion element is directly secured to each of the holding parts via a soldering connection.

17. The laser component according to claim 11, wherein the laser chip is arranged on one of the holding parts, or the laser chip is arranged on a chip carrier and the chip carrier is arranged on one of the holding parts.

* * * * *